(12) United States Patent
Jang et al.

(10) Patent No.: US 12,080,221 B2
(45) Date of Patent: Sep. 3, 2024

(54) DISPLAY DEVICE FOR REDUCING DETERIORATION OF LIGHT-EMITTING ELEMENTS

(71) Applicant: Samsung Display Co., LTD., Yongin-si (KR)

(72) Inventors: Jin Won Jang, Anyang-si (KR); Seung Won Kuk, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 12 days.

(21) Appl. No.: 17/965,534

(22) Filed: Oct. 13, 2022

(65) Prior Publication Data

US 2023/0274685 A1 Aug. 31, 2023

(30) Foreign Application Priority Data

Feb. 25, 2022 (KR) ........................ 10-2022-0025276

(51) Int. Cl.
*G09G 3/30* (2006.01)
*G09G 3/20* (2006.01)
(Continued)

(52) U.S. Cl.
CPC ......... *G09G 3/2096* (2013.01); *G09G 3/3233* (2013.01); *G09G 2300/0819* (2013.01);
(Continued)

(58) Field of Classification Search
CPC ...... G09G 3/30; G09G 3/3208; G09G 3/3291; G09G 3/3688; G09G 5/397; G09G 2310/027
See application file for complete search history.

(56) References Cited

U.S. PATENT DOCUMENTS

| 2011/0187693 A1* | 8/2011 | Chung | G09G 3/3225 345/211 |
| 2016/0012799 A1* | 1/2016 | Kim | G09G 3/3233 345/82 |

(Continued)

FOREIGN PATENT DOCUMENTS

| KR | 10-1050211 B1 | 7/2011 |
| KR | 10-2011-0101938 A | 9/2011 |

(Continued)

*Primary Examiner* — Roy P Rabindranath
(74) *Attorney, Agent, or Firm* — Lewis Roca Rothgerber Christie LLP

(57) ABSTRACT

A display device comprises pixels arranged along rows and columns, and including light-emitting elements, a first transistor for supplying a driving current to the light-emitting elements, a second transistor for supplying a data voltage to a first node at a gate electrode of the first transistor, a third transistor for electrically connecting a second node, which is at a first electrode of the light-emitting elements, and a sensing line, and a fourth transistor for electrically connecting a third node, which is at a second electrode of the light-emitting elements, and the sensing line, and a display driver for driving the pixels, for sensing voltages of the second node and the third node to calculate a driving voltage across the light-emitting elements, and for compensating for the data voltage in case that the driving voltage exceeds a reference voltage.

19 Claims, 16 Drawing Sheets

(51) Int. Cl.
 *G09G 3/3233* (2016.01)
 *H01L 25/16* (2023.01)

(52) U.S. Cl.
 CPC . *G09G 2300/0842* (2013.01); *G09G 2310/08* (2013.01); *G09G 2320/0233* (2013.01); *G09G 2320/043* (2013.01); *G09G 2330/021* (2013.01); *G09G 2330/028* (2013.01); *G09G 2360/16* (2013.01); *H01L 25/167* (2013.01)

(56) References Cited

U.S. PATENT DOCUMENTS

2020/0219440 A1* 7/2020 Baek .................. H02M 1/36
2021/0273131 A1* 9/2021 Kang .................. H01L 24/82
2021/0343783 A1* 11/2021 Choi .................. H01L 27/12

FOREIGN PATENT DOCUMENTS

KR        10-1696749 B1    1/2017
KR    10-2021-0044938 A    4/2021

* cited by examiner

DISPLAY DEVICE FOR REDUCING DETERIORATION OF LIGHT-EMITTING ELEMENTS

CROSS-REFERENCE TO RELATED APPLICATION

This application claims priority to, and the benefit of, Korean Patent Application No. 10-2022-0025276 filed on Feb. 25, 2022, in the Korean Intellectual Property Office, the contents of which in its entirety are herein incorporated by reference.

BACKGROUND

1. Field

The present disclosure relates to a display device.

2. Description of the Related Art

As the information society develops, the demand for display devices for displaying images has increased and diversified. For example, display devices have been applied to various electronic devices, such as smartphones, digital cameras, laptop computers, navigation devices, and smart televisions. The display devices may be flat panel display devices, such as liquid crystal display devices, field emission display devices, or organic light-emitting display devices. Among such flat panel display devices, a light-emitting display device may display an image without a backlight unit providing light to a display panel because each of pixels of the display panel includes light-emitting elements that may emit light by themselves.

Each of a plurality of pixels of the display panel may include a plurality of light-emitting elements. The plurality of light-emitting elements may emit light by a driving current supplied from a pixel circuit of the pixel. When some of the plurality of light-emitting elements are not conducted, the driving current may be concentrated on the other light-emitting elements, and a hot spot phenomenon or deterioration may occur in the other light-emitting elements.

SUMMARY

Aspects of the present disclosure provide a display device capable of reducing or preventing a hot spot phenomenon of light-emitting elements and reducing or preventing deterioration of the light-emitting elements by reducing or preventing an overcurrent from flowing to the light-emitting elements.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to one or more embodiments of the disclosure, a display device includes pixels arranged along rows and columns, and including light-emitting elements, a first transistor for supplying a driving current to the light-emitting elements, a second transistor for supplying a data voltage to a first node at a gate electrode of the first transistor, a third transistor for electrically connecting a second node, which is at a first electrode of the light-emitting elements, and a sensing line, and a fourth transistor for electrically connecting a third node, which is at a second electrode of the light-emitting elements, and the sensing line, and a display driver for driving the pixels, for sensing voltages of the second node and the third node to calculate a driving voltage across the light-emitting elements, and for compensating for the data voltage in case that the driving voltage exceeds a reference voltage.

The display driver may be configured to determine compensation data based on a preset lookup table when the driving voltage exceeds the reference voltage.

The display driver may be configured to receive digital video data, to generate the data voltage, and to generate a compensated data voltage by applying the compensation data to the digital video data.

The compensated data voltage may be lower than the data voltage before being compensated.

The light-emitting elements may be connected in parallel between the second node and the third node, wherein a magnitude of a current flowing to one of the light-emitting elements increases as a number of light-emitting elements among the light-emitting elements, to which a collective current flows, decreases.

The display driver may be configured to drive the pixels based on a vertical synchronization signal having a low level and a high level during one frame period, wherein the display driver is configured to calculate driving voltages of pixels in some rows among the pixels during a rest period in which the vertical synchronization signal has a low level.

The second transistor may be configured to receive a scan write signal of a gate high level during a first period of the rest period, wherein the third transistor is configured to receive a first scan sensing signal of a gate high level during a first period of the rest period and a second period after the first period, and wherein the fourth transistor is configured to receive a second scan sensing signal of a gate high level during a third period after the second period of the rest period.

The first electrode may include a first portion extending in a first direction, and a second portion branching from the first portion, and extending in a second direction crossing the first direction, wherein the second electrode includes a first portion extending in the first direction, a second portion branching from one side of the first portion, and extending toward one side of the second portion of the first electrode, and a third portion branching from another side of the first portion, and extending toward another side of the second portion of the first electrode.

The light-emitting elements may include a first semiconductor layer including at least one semiconductor material doped with a p-type dopant, and electrically connected to the second portion of the first electrode, and a second semiconductor layer including at least one semiconductor material doped with an n-type dopant, and electrically connected to the second portion and the third portion of the second electrode.

The driving current may be configured to be supplied to the second portion of the first electrode, to be divided into the light-emitting elements, and to flow to the second portion and the third portion of the second electrode.

According to one or more embodiments of the disclosure, a display device includes pixels arranged along rows and columns, and including light-emitting elements, a first transistor for supplying a driving current to the light-emitting elements, a second transistor for supplying a data voltage to a first node at a gate electrode of the first transistor, a third transistor for electrically connecting a second node, which is at a source electrode of the first transistor, and a sensing line, a fourth transistor electrically connecting a third node and the sensing line, and a fifth transistor electrically connecting a fourth node and the sensing line, and a display driver for driving the pixels, for sensing voltages of the second to the fourth nodes to calculate a first driving voltage between the second and third nodes, for calculating a second driving voltage between the third and fourth nodes, and for compensating for the data voltage when at least one of the first and second driving voltages exceeds a reference voltage.

The display driver may be configured to determine compensation data based on a preset lookup table when at least one of the first and second driving voltages exceeds the reference voltage.

The display driver may be configured to receive digital video data, to generate the data voltage, and to generate a compensated data voltage by applying the compensation data to the digital video data.

The compensated data voltage may be lower than the data voltage before being compensated.

Some of the light-emitting elements may be connected in parallel between the second and third nodes, and others of the light-emitting elements may be connected in parallel between the third and fourth nodes, wherein a magnitude of a current flowing to one of the light-emitting elements increases as a number of the light-emitting elements, to which a collective current flows, decreases.

The display driver may be configured to drive the pixels based on a vertical synchronization signal having a low level and a high level during one frame period, and to calculate first and second driving voltages of pixels in some rows among the pixels during a rest period in which the vertical synchronization signal has a low level.

The second transistor may be configured to receive a scan write signal of a gate high level during a first period of the rest period, wherein the third transistor is configured to receive a first scan sensing signal of a gate high level during a first period of the rest period and a second period after the first period, wherein the fourth transistor is configured to receive a second scan sensing signal of a gate high level during a third period after the second period of the rest period, and wherein the fifth transistor is configured to receive a third scan sensing signal of a gate high level during a fourth period after the third period of the rest period.

The first electrode may include a first portion extending in a first direction, and a second portion branching from the first portion, and extending in a second direction crossing the first direction, wherein the second electrode includes a first portion extending in the first direction, a second portion branching from one side of the first portion, and extending toward one side of the second portion of the first electrode, and a third portion branching from another side of the first portion, and extending toward another side of the second portion of the first electrode.

The light-emitting elements may include a first semiconductor layer including at least one semiconductor material doped with a p-type dopant, and electrically connected to the second portion of the first electrode, and a second semiconductor layer including at least one semiconductor material doped with an n-type dopant, and electrically connected to the second portion and the third portion of the second electrode.

The driving current may be configured to be supplied to the second portion of the first electrode, to be divided into the light-emitting elements, and to flow to the second portion and the third portion of the second electrode.

With a display device according to one or more embodiments, a hot spot phenomenon of light-emitting elements, and deterioration of the light-emitting elements, may be reduced or prevented by calculating a driving voltage across the light-emitting elements, and by compensating for a data voltage when the driving voltage exceeds a reference voltage to decrease a magnitude of a driving current flowing to the light-emitting elements.

The aspects of the present disclosure are not limited to the aforementioned aspects, and various other aspects are included in the present specification.

BRIEF DESCRIPTION OF THE DRAWINGS

The above and other aspects of the present disclosure will become more apparent by describing in detail one or more embodiments thereof with reference to the attached drawings, in which.

DETAILED DESCRIPTION

Figure 1:
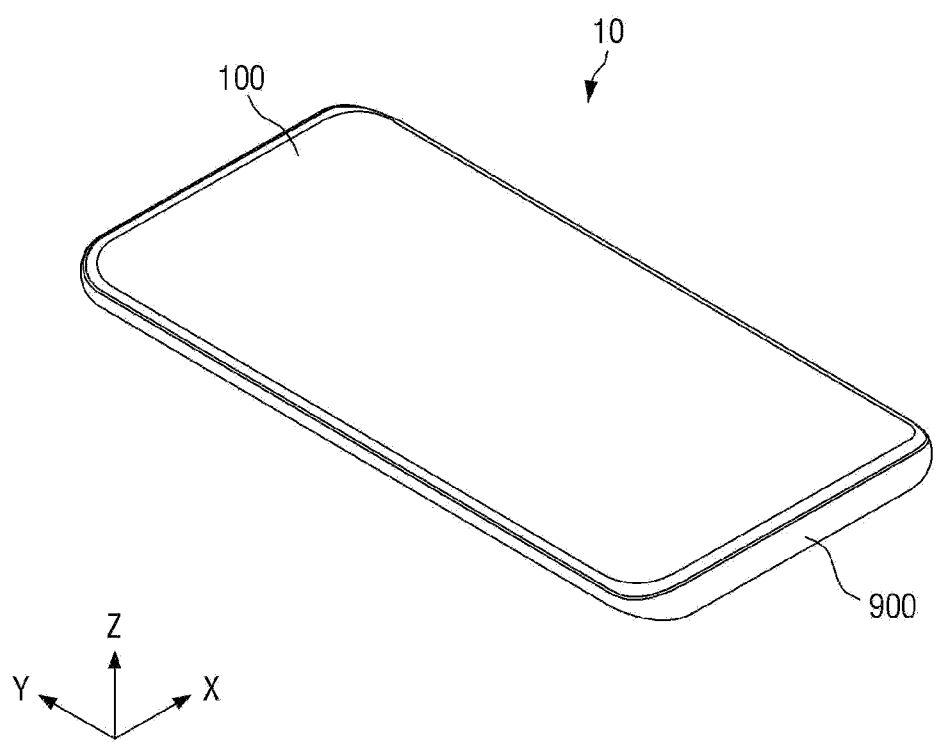
FIG. 1 is a perspective view illustrating a display device according to one or more embodiments.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods employing one or more of the disclosure disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of one or more embodiments may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When one or more embodiments may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation, not as terms of degree, and thus are utilized to account for inherent deviations in measured, calculated, and/or provided values that would be recognized by one of ordinary skill in the art.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or overly formal sense, unless clearly so defined herein.

Hereinafter, detailed embodiments of the present disclosure will be described with reference to the accompanying drawings.

Figure 2:
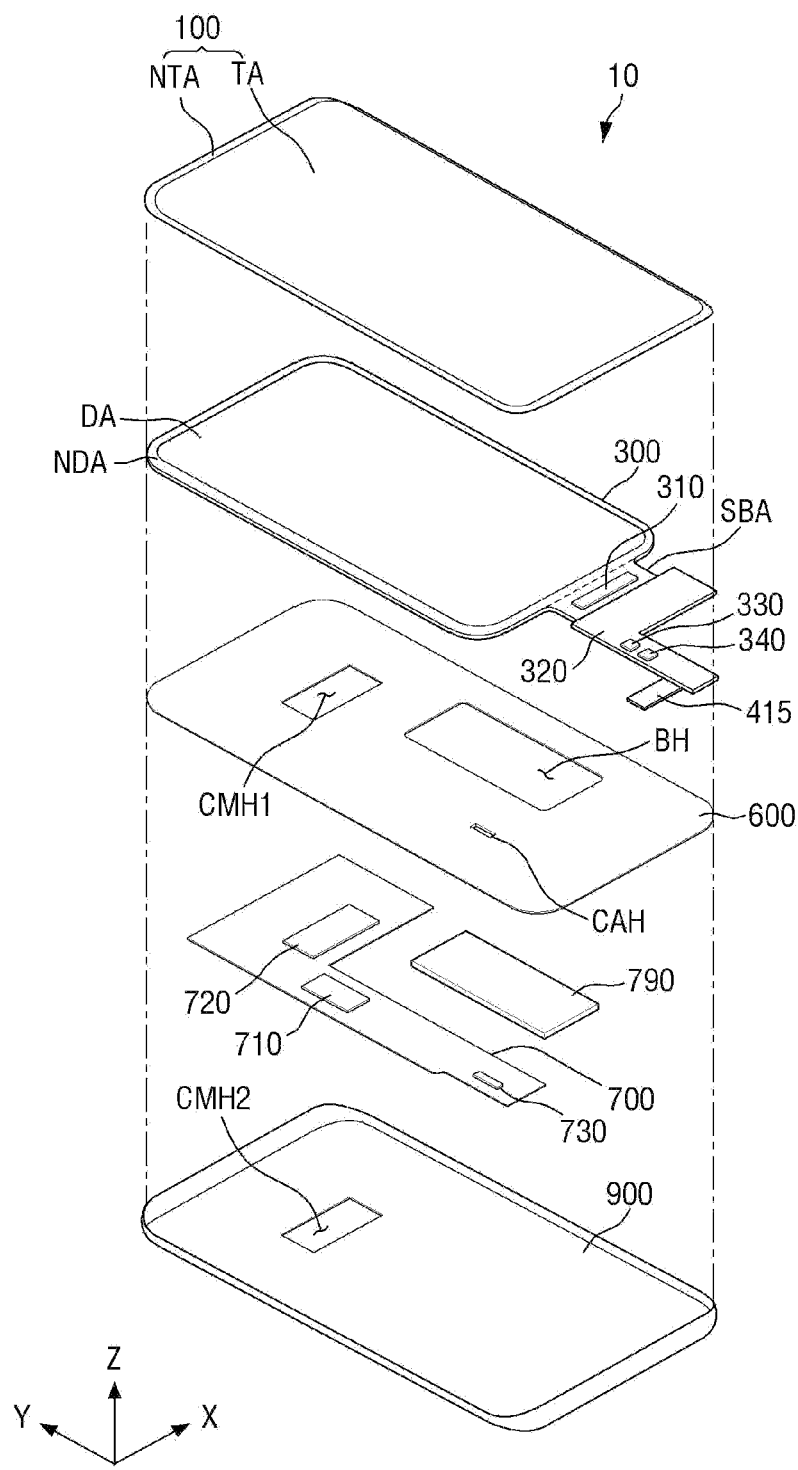
FIG. 2 is an exploded perspective view illustrating the display device according to one or more embodiments.

FIG. 1 is a perspective view illustrating a display device according to one or more embodiments, and FIG. 2 is an exploded perspective view illustrating the display device according to one or more embodiments.

Referring to FIGS. 1 and 2, a display device 10 includes a cover window 100, a display panel 300, a bracket 600, a main circuit board 700, and a lower cover 900.

The terms "above," "top," and "upper surface" as used herein refer to an upward direction (e.g., a Z-axis direction) with respect to the display device 10. The terms "below," "bottom," and "lower surface" as used herein refer to a downward direction (e.g., a direction opposite to the Z axis direction) with respect to the display device. In addition, "left," "right," "upper," and "lower" refer to directions when the display device 10 is viewed from above. For example, "left" refers to a direction opposite to an X-axis direction, "right" refers to the X-axis direction, "upper" refers to a Y-axis direction, and "lower" refers to a direction opposite to the Y-axis direction.

The display device 10 is a device that displays a moving image or a still image, and may be used as a display screen of various products, such as televisions, laptop computers, monitors, billboards, and Internet of Things (IOT) as well as portable electronic devices, such as mobile phones, smartphones, tablet personal computers (PCs), smart watches, watch phones, mobile communication terminals, electronic notebooks, electronic books, portable multimedia players (PMPs), navigation devices, and ultra mobile PCs (UMPCs).

The display device 10 may have a rectangular shape in plan view. For example, the display device 10 may have a rectangular shape, in plan view, having short sides in a first direction (X-axis direction) and long sides in a second direction (Y-axis direction). A corner where the short side in the first direction (X-axis direction) and the long side in the second direction (Y-axis direction) meet may be rounded with a curvature (e.g., a predetermined curvature) or right-angled. The shape of the display device 10 in plan view is not limited to a rectangular shape, and may be other polygonal shapes, a circular shape, or an elliptical shape.

The cover window 100 may be located above the display panel 300 to cover an upper surface of the display panel 300. The cover window 100 may protect the upper surface of the display panel 300.

The cover window 100 may include a transmission area TA corresponding to a display area DA of the display panel 300, and a non-transmission area NTA corresponding to a non-display area NDA of the display panel 300. The non-transmission area NTA may be formed to be opaque. As another example, the non-transmission area NTA may be formed as a decorative layer having a pattern that may be shown to a user when an image is not displayed.

The display panel 300 may be located below the cover window 100. Accordingly, an image displayed by the display panel 300 may be viewed on an upper surface of the display device 10 through the cover window 100.

The display panel 300 may be a light-emitting display panel including light-emitting elements. For example, the display panel 300 may be an organic light-emitting display panel using an organic light-emitting diode including an organic light-emitting layer, a quantum-dot light-emitting display panel using a quantum-dot light-emitting diode including a quantum-dot light-emitting layer, an inorganic light-emitting display panel using an inorganic light-emitting element including an inorganic semiconductor, or a micro light-emitting diode display panel using a micro light-emitting diode (LED)

The display panel 300 may include the display area DA, the non-display area NDA, and a sub-area SBA. The display area DA may overlap the transmission area TA of the cover window 100. The display area DA may include a plurality of pixels displaying an image, and the non-display area NDA is a peripheral area of the display area DA, and may not display an image. For example, the non-display area NDA may surround the display area DA, but is not limited thereto. The display area DA may occupy most of an area of the display panel 300.

The sub-area SBA may extend from one side of the non-display area NDA. The sub-area SBA may include a flexible material that may be bent, folded, and rolled. For example, when the sub-area SBA is bent, the sub-area SBA may overlap the display area DA in a thickness direction (Z-axis direction). The sub-area SBA may include a display driver 310 and pad parts connected to a circuit board 320. Alternatively, the sub-area SBA may be omitted, and the display driver 310 and the pad parts may be located in the non-display area NDA.

For example, the display panel 300 may include a touch sensor layer capable of sensing an object, such as a human finger or a pen. The touch sensor layer may include a plurality of touch electrodes, and may be located on a display layer at which the plurality of pixels are located.

The display panel 300 may include the display driver 310, the circuit board 320, a power supply unit 330, and a touch driver 340.

The display driver 310 may output signals and voltages for driving the display panel 300. For example, the display driver 310 may supply data voltages to data lines. The display driver 310 may supply source voltages to power lines and may supply gate control signals to a gate driver. Here, the source voltage may be at least one of a high potential voltage, an initialization voltage, a reference voltage, and a low potential voltage.

The circuit board 320 may be attached onto the pad parts using an anisotropic conductive film (ACF). Lead lines of the circuit board 320 may be electrically connected to the pad parts of the display panel 300. For example, the circuit board 320 may be a flexible printed circuit board (FPCB), a printed circuit board (PCB), or a flexible film, such as a chip on film (COF).

The power supply unit 330 may be located on the circuit board 320, and may supply a source voltage to the display drivers 310 and the display panel 300. The power supply unit 330 may generate a high potential voltage and may supply the high potential voltage to a high potential line, and may generate a common voltage and may supply the common voltage to a low potential line. The power supply unit 330 may generate an initialization voltage and may supply the initialization voltage to an initialization voltage line, and may generate a reference voltage and may supply the reference voltage to the display driver 310.

The touch driver 340 may be located on the circuit board 320 to measure capacitance of the touch electrodes. For example, the touch driver 340 may determine whether the user has performed a touch, a touch position of the user, and the like, based on a change in the capacitance of the touch electrodes. Here, the touch of the user means that an object, such as a user's finger or a pen comes into contact with or approaches one surface of the display device 10 on the touch sensor layer. The touch driver 340 may distinguish a portion where a touch occurs and a portion where a touch does not occur among the plurality of touch electrodes to determine the touch position.

The bracket 600 may be located below the display panel 300. The bracket 600 may be made of plastic, a metal, or a combination thereof. For example, the bracket 600 may include a first camera hole CMH1 into which a first camera sensor 720 is inserted, a battery hole BH in which a battery 790 is located, and a cable hole CAH through which a cable 415, which is connected to the display driver 310 or the circuit board 320, passes.

The main circuit board 700 and the battery 790 may be located below the bracket 600. The main circuit board 700 may be a printed circuit board or a flexible printed circuit board.

The main circuit board 700 may include a main processor 710, the first camera sensor 720, and a main connector 730. The first camera sensor 720 may be located on both of upper and lower surfaces of the main circuit board 700, the main processor 710 may be located on the upper surface of the main circuit board 700, and the main connector 730 may be located on the upper surface of the main circuit board 700.

The main processor 710 may control all functions of the display device 10. For example, the main processor 710 may supply digital video data to the display driver 310 so that the display panel 300 displays the image. The main processor 710 may receive touch data from the touch driver 340, may determine touch coordinates of the user, and then may execute an application indicated by an icon displayed on the touch coordinates of the user.

The main processor 710 may convert first image data input from the first camera sensor 720 into digital video data, and may output the digital video data to the display driver 310 through the circuit board 320 to display an image captured by the first camera sensor 720 on the display panel 300.

The first camera sensor 720 may process an image frame, such as a still image or a moving image obtained by an image sensor, and may output the processed image frame to the main processor 710. For example, the first camera sensor 720 may be a complementary metal oxide semiconductor (CMOS) image sensor or a charge coupled device (CCD) sensor, but is not limited thereto. The first camera sensor 720 may be exposed to a lower surface of the lower cover 900 by a second camera hole CMH2, and may capture an image of an object or a background located below the display device 10.

The main connector 730 may be connected to the cable 415 passing through the cable hole CAH of the bracket 600. Accordingly, the main circuit board 700 may be electrically connected to the display driver 310 or the circuit board 320.

The battery 790 might not overlap the main circuit board 700 in a third direction (Z-axis direction). The battery 790 may overlap the battery hole BH of the bracket 600.

The main circuit board 700 may further include a mobile communication module capable of transmitting and receiving wireless signals to and from at least one of a base station, an external terminal, and a server on a mobile communication network. The wireless signal may include various types of data according to transmission/reception of a voice signal, a video call signal, or a text/multimedia message.

The lower cover 900 may be located below the main circuit board 700 and the battery 790. The lower cover 900 may be fastened and fixed to the bracket 600. The lower cover 900 may form an appearance of a lower surface of the display device 10. The lower cover 900 may be made of plastic, a metal, or a combination thereof.

The lower cover 900 may include the second camera hole CMH2 through which a lower surface of the first camera sensor 720 is exposed. A position of the first camera sensor 720 and positions of the first and second camera holes CMH1 and CMH2 corresponding to the first camera sensor 720 are not limited to those in one or more embodiments illustrated in FIG. 2.

Figure 3:
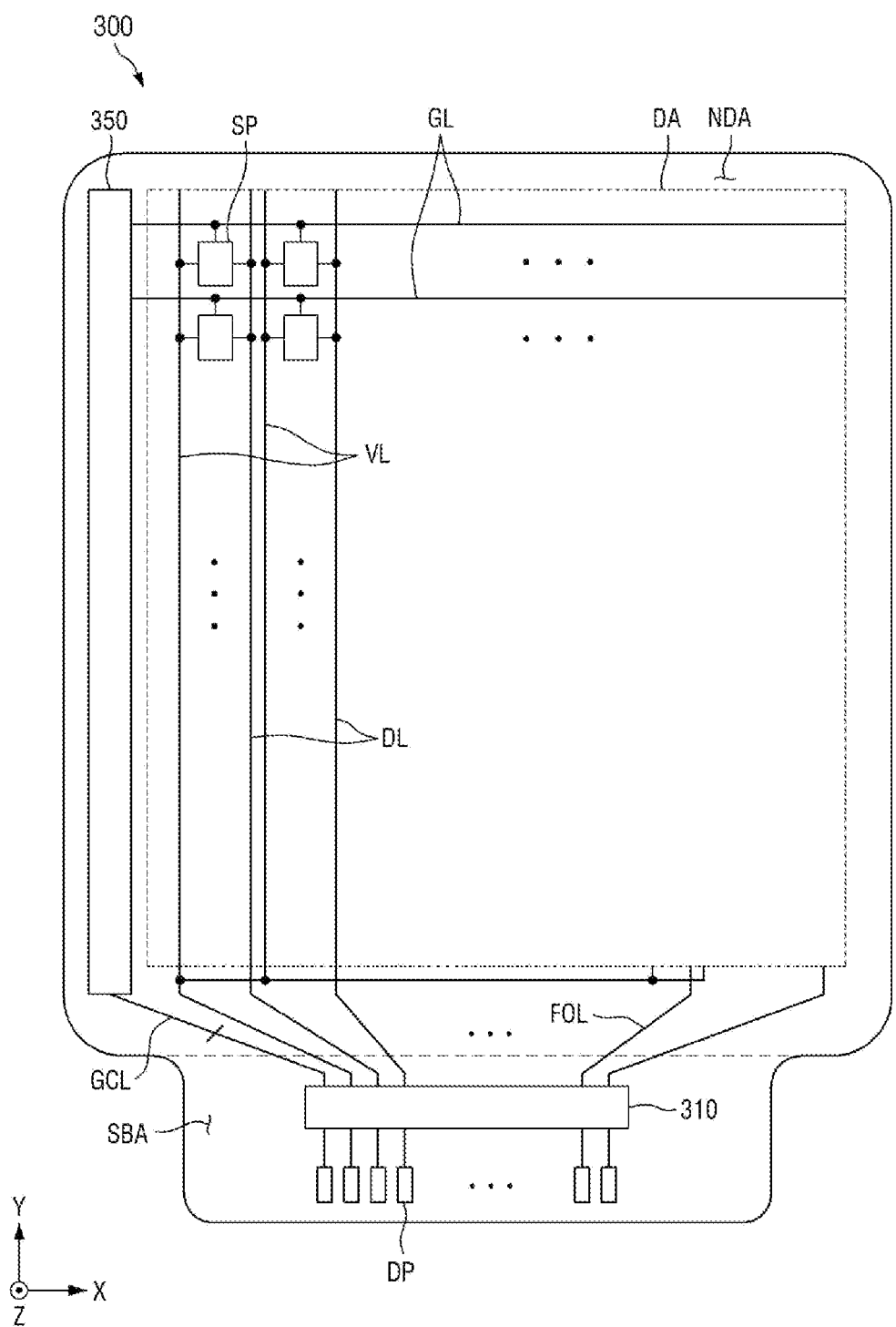
FIG. 3 is a plan view illustrating a display panel according to one or more embodiments.

FIG. 3 is a plan view illustrating a display panel according to one or more embodiments.

Referring to FIG. 3, the display panel 300 may include a display area DA, a non-display area NDA, and a sub-area SBA.

The display area DA is an area displaying an image, and may be defined as a central area of the display panel 300. The display area DA may include a plurality of pixels SP, a plurality of gate lines GL, a plurality of data lines DL, and a plurality of power lines VL. Each of the plurality of pixels SP may be defined as a minimum unit for outputting light.

The plurality of gate lines GL may supply gate signals received from a gate driver 350 to the plurality of pixels SP. The plurality of gate lines GL may extend in the first direction (X-axis direction), and may be spaced apart from each other in the second direction (Y-axis direction) crossing the first direction (X-axis direction).

The plurality of data lines DL may supply data voltages received from the display driver 310 to the plurality of pixels SP. The plurality of data lines DL may extend in the second direction (Y-axis direction), and may be spaced apart from each other in the first direction (X-axis direction).

The plurality of power lines VL may supply a source voltage received from the display driver 310 or the power supply unit 330 to the plurality of pixels SP. Here, the source voltage may be at least one of a high potential voltage, an initialization voltage, a reference voltage, and a low potential voltage. The plurality of power lines VL may extend in the second direction (Y-axis direction), and may be spaced apart from each other in the first direction (X-axis direction).

The non-display area NDA may surround the display area DA. The non-display area NDA may include the gate driver 350, fan-out lines FOL, and gate control lines GCL. The gate driver 350 may generate a plurality of gate signals based on gate control signals, and may sequentially supply the plurality of gate signals to the plurality of gate lines GL according to a set order.

The fan-out lines FOL may extend from the display driver 310 to the display area DA. The fan-out lines FOL may supply data voltages received from the display driver 310 to the plurality of data lines DL.

The gate control lines GCL may extend from the display driver 310 to the gate driver 350. The gate control lines GCL may supply the gate control signals received from the display driver 310 to the gate driver 350.

The sub-area SBA may include the display driver 310 and a plurality of pad parts DP. The display driver 310 may output signals and voltages for driving the display panel 300 to the fan-out lines FOL. The display driver 310 may supply the data voltages to the data lines DL through the fan-out lines FOL. The data voltages may be supplied to the plurality of pixels SP, and may determine luminance of the plurality of pixels SP. The display driver 310 may supply the gate control signals to the gate driver 350 through the gate control lines GCL.

The plurality of pad parts DP may be located at an edge of the sub-area SBA. The pad parts DP may be electrically connected to the circuit board 320 using a low-resistance and high-reliability material, such as an anisotropic conductive film or self-assembly anisotropic conductive paste (SAP). The pad parts DP may be connected to a graphic system through the circuit board 320. The pad parts DP may be electrically connected to the circuit board 320 to receive digital video data, and may supply the digital video data to the display driver 310.

Figure 4:
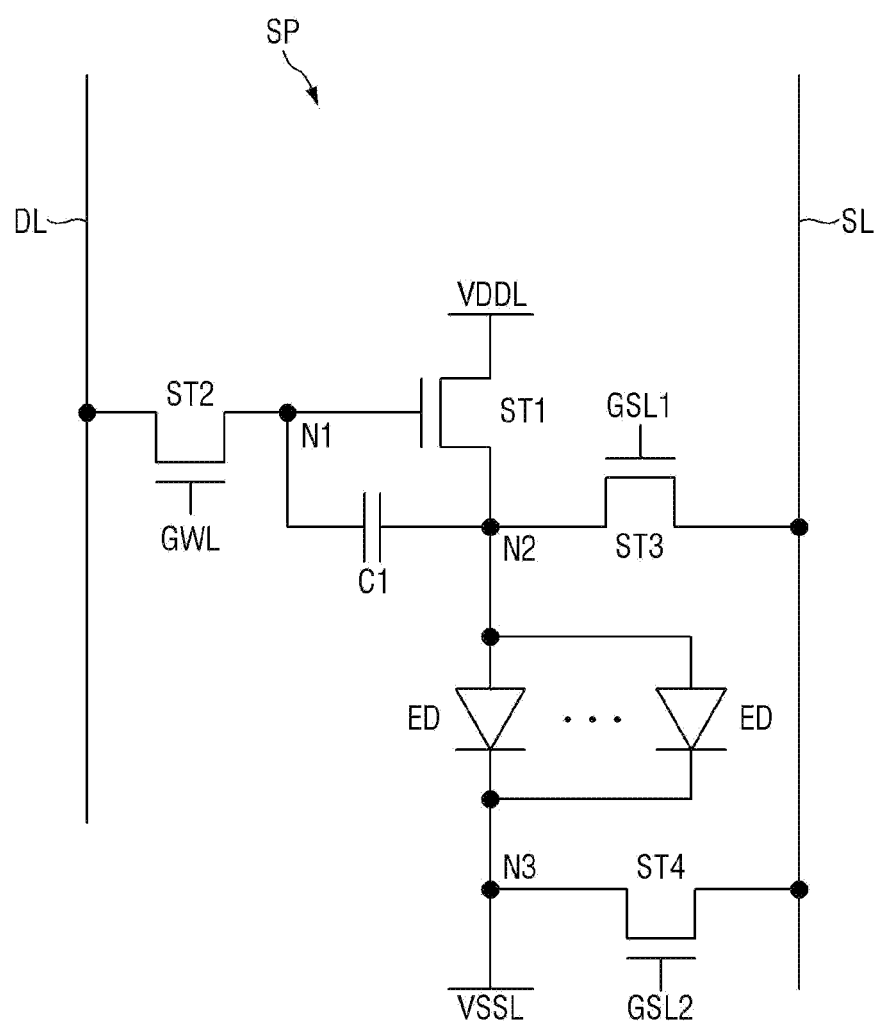
FIG. 4 is a circuit diagram illustrating a pixel of the display device according to one or more embodiments.

FIG. 4 is a circuit diagram illustrating a pixel of the display device according to one or more embodiments.

Referring to FIG. 4, the display panel 300 may include a plurality of pixels SP. Each of the plurality of pixels SP may be connected to a scan write line GWL, a first scan sensing line GSL1, a second scan sensing line GSL2, a data line DL, a sensing line SL, a high potential line VDDL, and a low potential line VSSL.

The pixel SP may include first to fourth transistors ST1, ST2, ST3, and ST4, a first capacitor C1, and a plurality of light-emitting elements ED.

The first transistor ST1 may include a gate electrode, a drain electrode, and a source electrode. The gate electrode of the first transistor ST1 may be connected to a first node N1, the drain electrode of the first transistor ST1 may be connected to the high potential line VDDL, and the source electrode of the first transistor ST1 may be connected to a second node N2. The first transistor ST1 may be a driving transistor adjusting a current flowing from the high potential line VDDL to the light-emitting element ED according to a voltage difference between the gate electrode and the source electrode. The first transistor ST1 may control a drain-source current (or a driving current) based on a data voltage applied to the gate electrode.

The plurality of light-emitting elements ED may receive the driving current to emit light. The plurality of light-emitting elements ED may be connected to each other in parallel between the second node N2 and a third node N3, but are not limited thereto. A light emission amount or luminance of the light-emitting element ED may be proportional to a magnitude of the driving current. The light-emitting element ED may include at least one of an organic light-emitting diode (LED) including an organic light-emitting layer, a quantum dot LED including a quantum-dot light-emitting layer, an inorganic LED including an inorganic semiconductor, and a micro LED, but is not limited thereto.

A first electrode of the light-emitting element ED may be connected to the second node N2. The first electrode of the light-emitting element ED may be connected to the source electrode of the first transistor ST1, a drain electrode of the third transistor ST3, and a second capacitor electrode of the first capacitor C1 through the second node N2. A second electrode of the light-emitting element ED may be connected to the third node N3, which is the low potential line VSSL.

The second transistor ST2 may be turned on by a scan write signal of the scan write line GWL to electrically connect the data line DL and the first node N1, which is the gate electrode of the first transistor ST1, to each other. The second transistor ST2 may be turned on based on the scan write signal to supply a data voltage to the first node N1. A gate electrode of the second transistor ST2 may be connected to the scan write line GWL, a drain electrode of the second transistor ST2 may be connected to the data line DL, and a source electrode of the second transistor ST2 may be connected to the first node N1. The source electrode of the second transistor ST2 may be connected to the gate electrode of the first transistor ST1 and a first capacitor electrode of the first capacitor C1 through the first node N1.

The third transistor ST3 may be turned on by a first scan sensing signal of the first scan sensing line GSL1 to electrically connect the second node N2, which is the source electrode of the first transistor ST1, and the sensing line SL to each other. The third transistor ST3 may be turned on based on the first scan sensing signal to supply an initialization voltage to the second node N2. The third transistor ST3 may be turned on based on the first scan sensing signal to supply a voltage of the second node N2 to the sensing line SL. A gate electrode of the third transistor ST3 may be connected to the first scan sensing line GSL1, the drain electrode of the third transistor ST3 may be connected to the second node N2, and a source electrode of the third transistor ST3 may be connected to the sensing line SL. The drain electrode of the third transistor ST3 may be connected to the source electrode of the first transistor ST1, the second capacitor electrode of the first capacitor C1, and the first electrode of the light-emitting element ED through the second node N2.

The fourth transistor ST4 may be turned on by a second scan sensing signal of the second scan sensing line GSL2 to electrically connect the third node N3, which is the second electrode of the light-emitting element ED, and the sensing line SL to each other. The fourth transistor ST4 may be turned on based on the second scan sensing signal to supply a voltage of the third node N3 to the sensing line SL. A gate electrode of the fourth transistor ST4 may be connected to the second scan sensing line GSL2, a drain electrode of the fourth transistor ST4 may be connected to the third node N3, and a source electrode of the fourth transistor ST4 may be connected to the sensing line SL. The drain electrode of the fourth transistor ST4 may be connected to the second electrode of the light-emitting element ED and the low potential line VSSL through the third node N3.

The drain electrode and the source electrode of each of the first to fourth transistors ST1, ST2, ST3, and ST4 are not limited to the above description, and may be formed opposite to each other. For example, each of the first to fourth transistors ST1, ST2, ST3, and ST4 may be an N-channel metal oxide semiconductor field effect transistor (MOSFET), but is not limited thereto.

Figure 5:
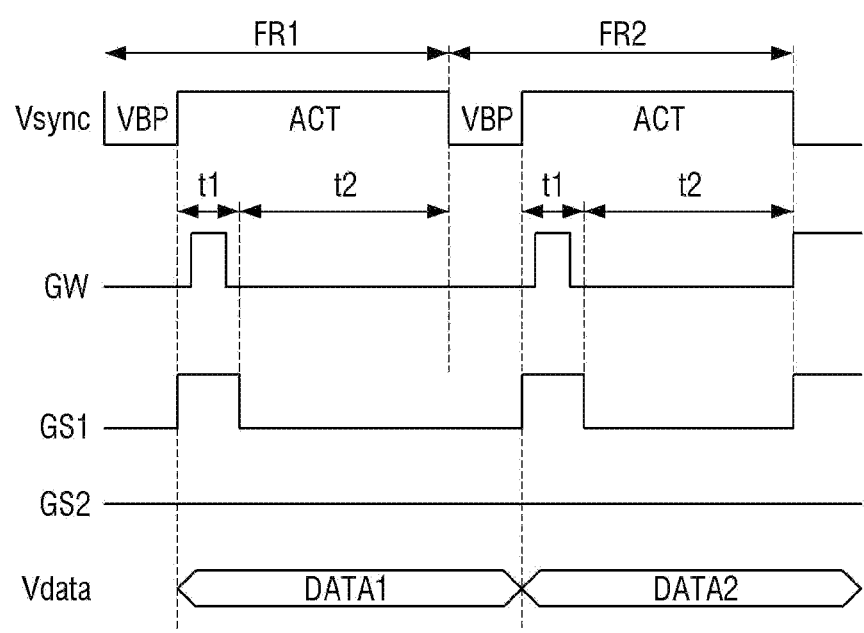
FIG. 5 is a timing diagram illustrating signals and voltages of the display device according to one or more embodiments.

FIG. 5 is a timing diagram illustrating signals and voltages of the display device according to one or more embodiments.

Referring to FIG. 5, the display driver 310 and the gate driver 350 may drive the plurality of pixels SP based on a vertical synchronization signal Vsync. The vertical synchronization signal Vsync may have one low level and one high level during one frame period. The vertical synchronization signal Vsync may have a low level during a rest period VBP, and may have a high level during an active period ACT. The plurality of pixels SP may emit light during the active period ACT. Pixels SP located in some rows among the plurality of pixels SP may be sensed by the display driver 310 during the rest period VBP, and pixels SP located in some other rows among the plurality of pixels SP may maintain luminance in the previous active period ACT during the rest period VBP.

The display driver 310 may receive first and second digital video data DATA1 and DATA2 from the graphic system. The display driver 310 may output a data voltage Vdata generated based on the first digital video data DATA1 during a first frame period FR1. The display driver 310 may output a data voltage Vdata generated based on the second digital video data DATA2 during a second frame period FR2.

A first period t1 of each of the first and second frame periods FR1 and FR2 may be a data addressing period in which the data voltage is supplied to the plurality of pixels SP. A second period t2 of each of the first and second frame periods FR1 and FR2 may be a blank period in which the data voltage is not supplied to the plurality of pixels SP.

A scan write signal GW may have a gate high level during the first period t1, and the display driver 310 may supply the data voltage Vdata to the second transistor ST2 of the pixel SP. A first scan sensing signal GS1 may have a gate high level during the first period t1, and the display driver 310 may supply an initialization voltage to the third transistor ST3 of the pixel SP. The pixel SP may emit light having luminance according to the data voltage Vdata during the second period t2.

A second scan sensing signal GS2 may have a gate low level during the first and second periods t1 and t2. The second scan sensing signal GS2 may be supplied to sense voltages of the third nodes N3 of the pixels SP located in some rows during the rest period VBP.

Figure 6:
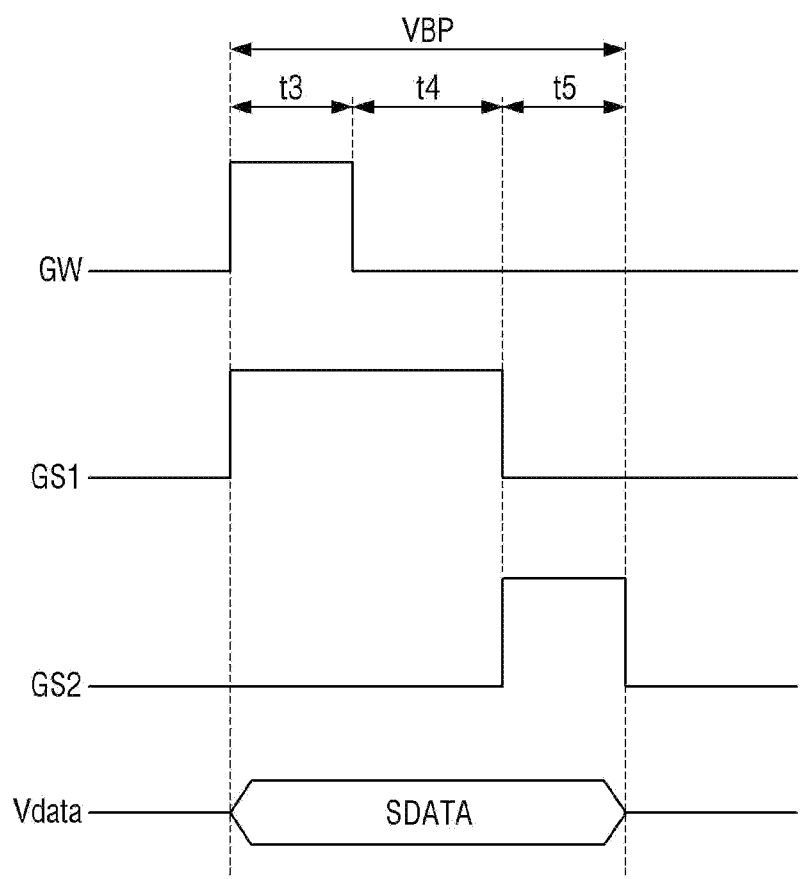
FIG. 6 is a timing diagram illustrating signals and voltages of some pixels during a rest period in the display device according to one or more embodiments.

FIG. 6 is a timing diagram illustrating signals and voltages of some pixels during a rest period in the display device according to one or more embodiments.

Referring to FIG. 6, the pixels SP located in some rows among the plurality of pixels SP may be sensed by the display driver 310 during the rest period VBP. The pixels SP arranged in some other rows among the plurality of pixels SP may maintain the luminance in the previous active period ACT during the rest period VBP. The display driver 310 may sense voltages of the second node N2 and the third node N3 during the rest period VBP.

The pixel SP may receive a scan write signal GW of a gate high level, and may receive a first scan sensing signal GS1 of a gate high level, during a third period t3 of the rest period VBP. The data line DL may supply a data voltage Vdata corresponding to sensing data SDATA to the pixel SP during the third period t3. The second transistor ST2 may be turned on during the third period t3 to supply the data voltage Vdata to the first node N1, which is the gate electrode of the first transistor ST1. The third transistor ST3 may be turned on during the third period t3 to supply an initialization voltage to the second node N2, which is the source electrode of the first transistor ST1.

The pixel SP may receive the first scan sensing signal GS1 of the gate high level during a fourth period t4 of the rest period VBP. The third transistor ST3 may be turned on during the fourth period t4 to supply the voltage of the second node N2 to the sensing line SL. Accordingly, the display driver 310 may sense the voltage of the second node N2.

The pixel SP may receive a second scan sensing signal GS2 of a gate high level during a fifth period t5 of the rest period VBP. The fourth transistor ST4 may be turned on during the fifth period t5 to supply the voltage of the third node N3 to the sensing line SL. Accordingly, the display driver 310 may sense the voltage of the third node N3.

Figure 7:
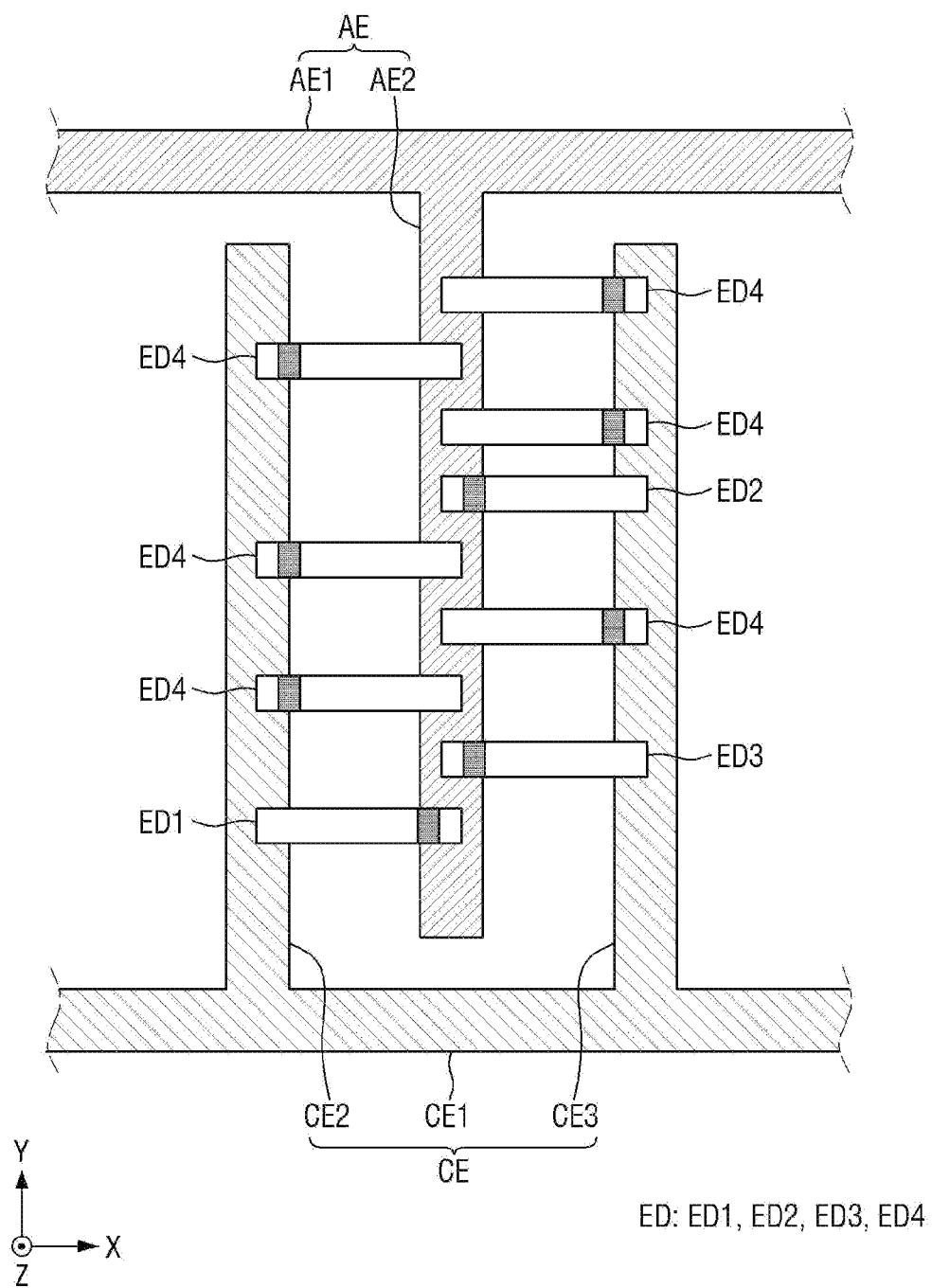
FIG. 7 is a plan view illustrating a plurality of light-emitting elements of the display device according to one or more embodiments.
Figure 8:
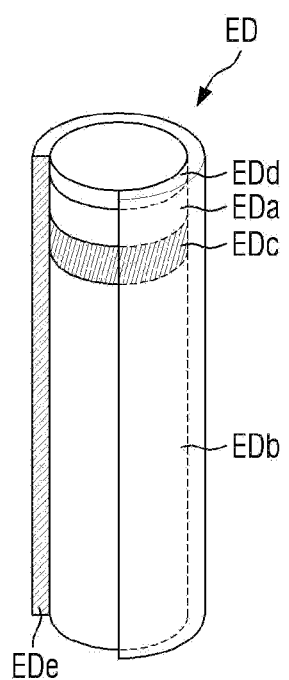
FIG. 8 is a perspective view illustrating a light-emitting element of the display device according to one or more embodiments.
Figure 9:
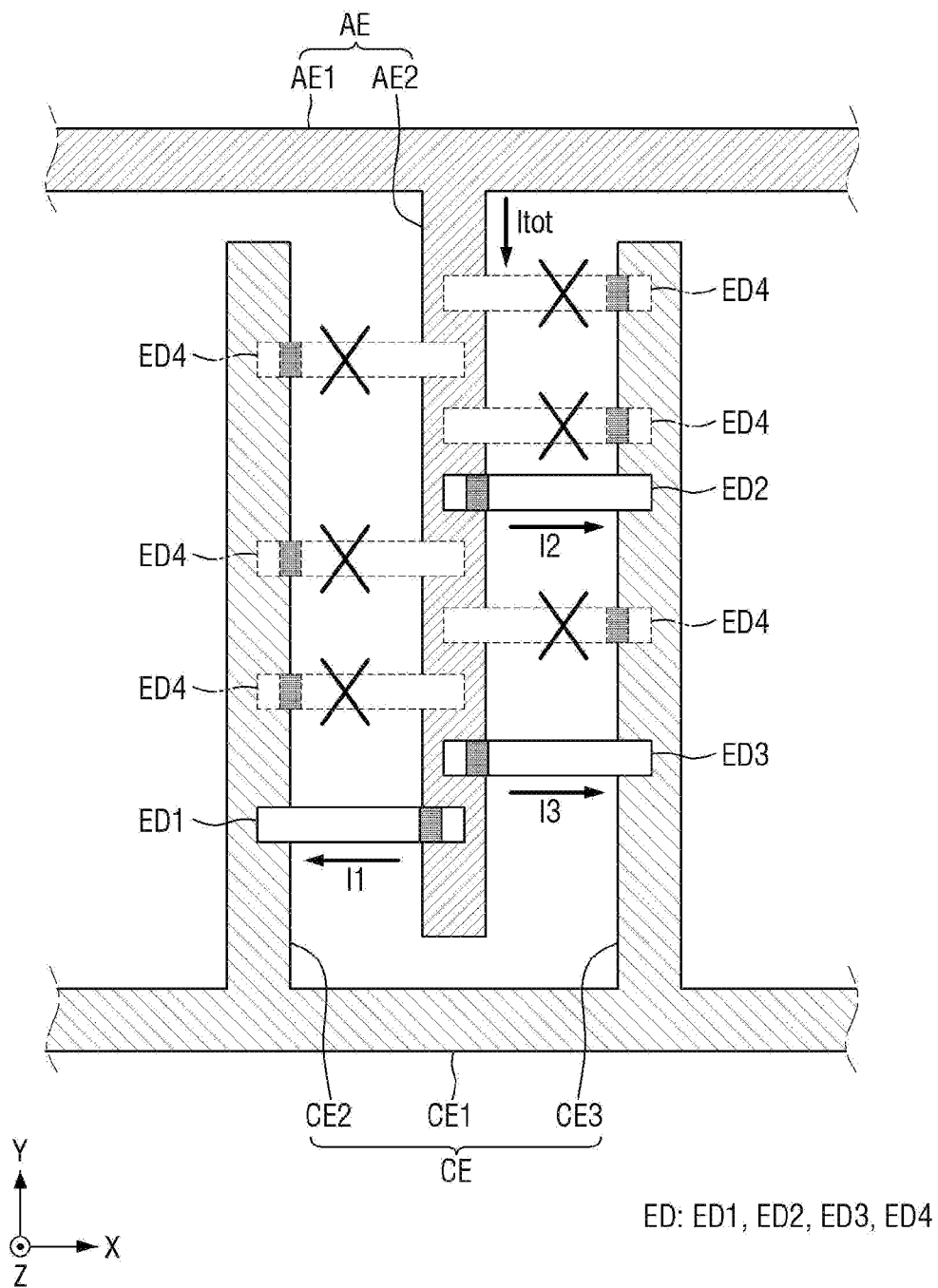
FIG. 9 is a plan view illustrating an example of a current flowing to a plurality of light-emitting elements in the display device according to one or more embodiments.
Figure 10:
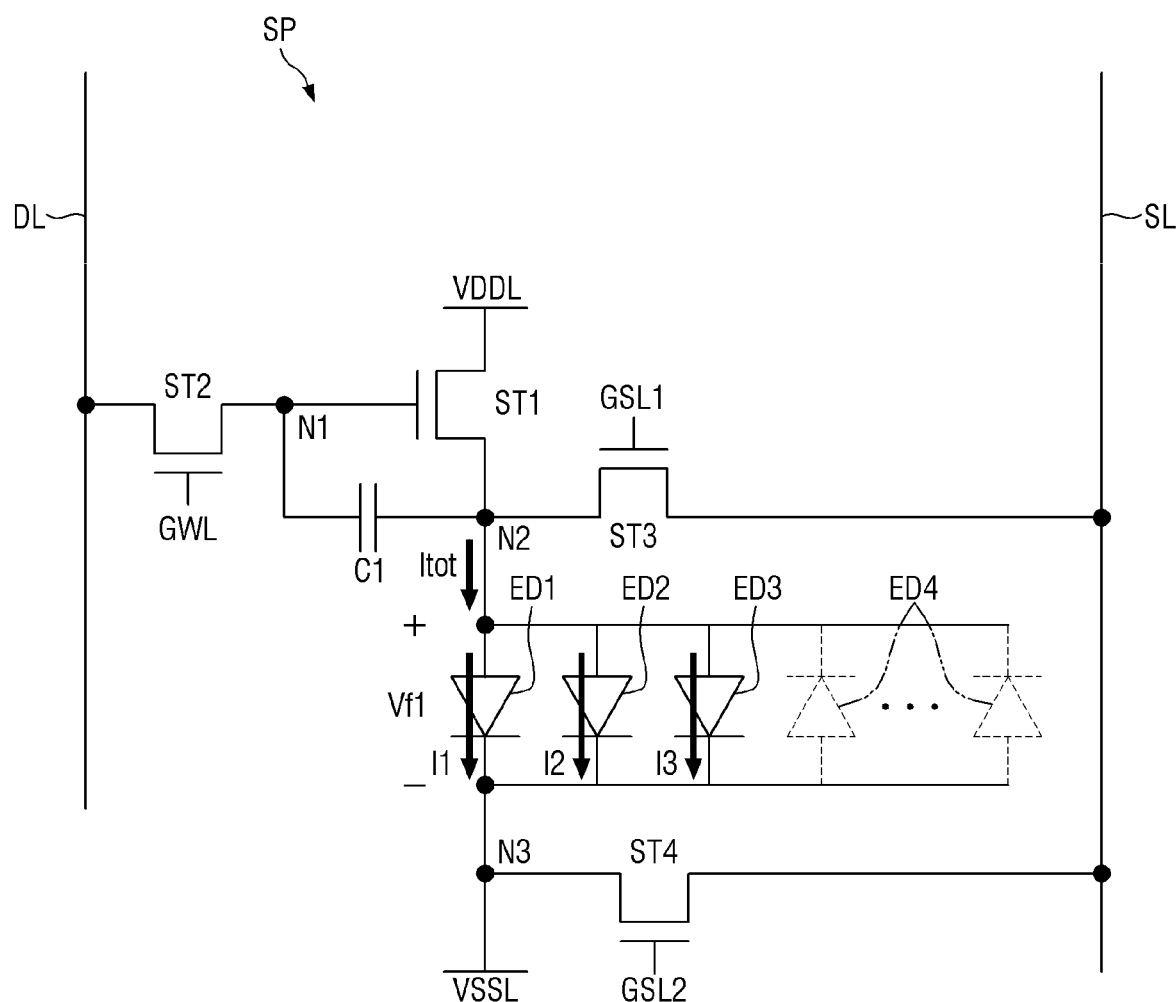
FIG. 10 is a circuit diagram illustrating the display device of FIG. 9.

FIG. 7 is a plan view illustrating a plurality of light-emitting elements of the display device according to one or more embodiments, and FIG. 8 is a perspective view illustrating a light-emitting element of the display device according to one or more embodiments. FIG. 9 is a plan view illustrating an example of a current flowing to a plurality of light-emitting elements in the display device according to one or more embodiments, and FIG. 10 is a circuit diagram illustrating the display device of FIG. 9.

Referring to FIGS. 7 to 10, the pixel SP may include a first electrode AE, a second electrode CE, and a plurality of light-emitting elements ED.

The first electrode AE may be a pixel electrode separated for each of the plurality of pixels SP. The first electrode AE may include a first portion AE1 extending in the first direction (X-axis direction), and a second portion AE2 branching from the first portion AE1. The first portion AE1 of the first electrode AE may be electrically connected to the second node N2 illustrated in FIG. 4.

The second portion AE2 of the first electrode AE may branch from the first portion AE1 and extend in a direction opposite to the second direction (Y-axis direction). The second portion AE2 of the first electrode AE may be located between a second portion CE2 and a third portion CE3 of the second electrode CE. The second portion AE2 of the first electrode AE may be substantially in parallel with the second portion CE2 and the third portion CE3 of the second electrode CE, and may be spaced apart from the second portion CE2 and the third portion CE3 of the second electrode CE.

The first electrodes AE of the plurality of pixels SP may receive different signals, and may be independently driven. The first electrode AE may receive a driving current Itot from a pixel circuit of the pixel SP, and the driving current Itot may be divided and may flow to the plurality of light-emitting elements ED. The plurality of light-emitting elements ED may emit light of a corresponding wavelength band, and may have luminance proportional to a magnitude of the current.

The second electrode CE may include a first portion CE1 extending in the first direction (X-axis direction), the second portion CE2 branching from one side of the first portion CE1, and a third portion CE3 branching from the other side of the first portion CE1. The first portion CE1 of the second electrode CE may be electrically connected to the third node N3 illustrated in FIG. 4.

The second portion CE2 of the second electrode CE may branch from one side of the first portion CE1, and may extend in the second direction (the Y-axis direction). The third portion CE3 of the second electrode CE may branch from the other side of the first portion CE1, and may extend substantially in parallel with the second portion CE2 of the second electrode CE.

The plurality of light-emitting elements ED may be aligned by electric fields formed between the first and second electrodes AE and CE. The plurality of light-emitting elements ED may be aligned between the second portion AE2 of the first electrode AE and the second portion CE2 of the second electrode CE, or between the second portion AE2 of the first electrode AE and the third portion CE3 of the second electrode CE. The plurality of light-emitting elements ED may share the first electrode AE with each other. Some of the plurality of light-emitting elements ED may be located adjacent to each other, some others of the plurality of light-emitting elements ED may be spaced apart from each other at regular intervals, and some others of the plurality of light-emitting element ED may have a non-uniform density, and may be aligned in a corresponding direction. For example, some of the light-emitting elements ED may be located along the first direction (X-axis direction), and some others of the light-emitting elements ED may be located along a diagonal direction between the first direction (X-axis direction) and the second direction (Y-axis direction).

The plurality of light-emitting elements ED may include active layers having the same material to emit light of the same wavelength band or light of the same color. The plurality of pixels SP may emit light of the same color. As an example, the plurality of light-emitting elements ED may emit light, or blue light, having a peak wavelength in the range of about 440 nm to about 480 nm. Accordingly, a light-emitting element layer of the display device 10 may emit the blue light. As another example, the plurality of pixels SP may include light-emitting elements ED having different active layers to emit light of different colors, respectively.

Referring to FIG. 8, the light-emitting element ED may include a first semiconductor part EDa, a second semiconductor part EDb, an active layer EDc, an electrode layer EDd, and an insulating film EDe.

The first semiconductor part EDa may be located on the active layer EDc. The first semiconductor part EDa may be electrically connected to the first electrode AE through the electrode layer EDd. For example, when the light-emitting element ED emits blue or green light, the first semiconductor part EDa may include a semiconductor material having a chemical formula of $Al_xGa_yIn_{1-x-y}N$ ($0 \leq x \leq 1$, $0 \leq y \leq 1$, and $0 \leq x+y \leq 1$). For example, the first semiconductor part EDa may include at least one semiconductor material of AlGaInN, GaN, AlGaN, InGaN, AlN, and InN doped with a p-type dopant. The first semiconductor part EDa may be doped with a p-type dopant, such as Mg, Zn, Ca, Se, or Ba. The first semiconductor part EDa may be made of p-GaN doped with p-type Mg. A length of the first semiconductor part EDa may be in the range of about 0.05 µm to about 0.10 µm, but is not limited thereto.

The second semiconductor part EDb may be electrically connected to the second electrode CE. The second semiconductor part EDb may be an n-type semiconductor. For example, when the light-emitting element ED emits blue light, the second semiconductor part EDb may include a semiconductor material having a chemical formula of $Al_xGa_yIn_{1-x-y}N$ ($0 \leq x \leq 1$, $0 \leq y \leq 1$, and $0 \leq x+y \leq 1$). The second semiconductor part EDb may include at least one semiconductor material of AlGaInN, GaN, AlGaN, InGaN, AlN, and InN doped with an n-type dopant. The second semiconductor part EDb may be doped with an n-type dopant, such as Si, Ge, or Sn. The second semiconductor part EDb may be made of n-GaN doped with n-type Si. A length of the second semiconductor part EDb may be in the range of about 1.5 µm to about 5 µm, but is not limited thereto.

Each of the first and second semiconductor parts EDa and EDb may be formed as one layer, but is not limited thereto. For example, each of the first and second semiconductor parts EDa and EDb may have a plurality of layers by further including a clad layer or a tensile strain barrier reducing (TSBR) layer.

The active layer EDc may be located between the first and second semiconductor parts EDa and EDb. The active layer EDc may include a material having a single or multiple quantum well structure. When the active layer EDc includes the material having the multiple quantum well structure, the active layer EDc may include a plurality of quantum layers and well layers that are alternately stacked. The active layer EDc may emit light by a combination of electron-hole pairs according to electrical signals applied through the first and second semiconductor parts EDa and EDb. For example, when the active layer EDc includes a material, such as AlGaN or AlGaInN, the active layer EDc may emit blue light. When the active layer EDc has a multiple quantum well structure, that is, a structure in which the quantum layers and the well layers are alternately stacked, the quantum layers may include a material, such as AlGaN or AlGaInN, and the well layers may include a material, such as GaN or AlInN. The active layer EDc may include the quantum layer made of AlGaInN and the well layer made of AlInN and thus, emit the blue light.

As another example, the active layer EDc may have a structure in which semiconductor materials having large band gap energy and semiconductor materials having small band gap energy are alternately stacked, and may include Group III to Group V semiconductor materials depending on a wavelength band of emitted light. The light emitted by the active layer EDc is not limited to the blue light, and in some case, the active layer EDc may emit red or green light. A length of the active layer EDc may be in the range of about 0.05 µm to about 0.10 µm, but is not limited thereto.

The light emitted from the active layer EDc may be emitted not only in a length direction of the light-emitting element ED, but also to both sides of the light-emitting element ED. A direction of the light emitted from the active layer EDc may not be limited.

The electrode layer EDd may be an ohmic contact electrode. As another example, the electrode layer EDd may be a Schottky contact electrode. The light-emitting element ED may include at least one electrode layer EDd. The electrode layer EDd may include a metal having conductivity. For example, the electrode layer EDd may include at least one of aluminum (Al), titanium (Ti), indium (In), gold (Au), silver (Ag), indium tin oxide (ITO), indium zinc oxide (IZO), and indium tin zinc oxide (ITZO). The electrode layer EDd may also include a semiconductor material doped with an n-type or p-type dopant.

The insulating film EDe may surround outer surfaces of the first and second semiconductor parts EDa and EDb, the active layer EDc, and the electrode layer EDd. The insulating film EDe may protect the light-emitting element ED. For example, the insulating film EDe may surround a side surface of the light-emitting element ED, and may expose both ends of the light-emitting element ED in the length direction.

The insulating film EDe may include materials having insulating properties, such as silicon oxide ($SiO_x$), silicon nitride ($SiN_x$), silicon oxynitride ($SiO_xN_y$), aluminum nitride (AlN), and aluminum oxide ($Al_2O_3$). Accordingly, the insulating film EDe may reduce or prevent the likelihood of an electrical short circuit that may occur when the active layer EDc is in direct contact with an electrode through which an electrical signal is transferred to the light-emitting element ED. In addition, the insulating film EDe protects an outer surface of the light-emitting element ED as well as the active layer EDc, and may thus reduce or prevent a decrease in luminous efficiency.

An outer surface of the insulating film EDe may be surface-treated. When the display panel 300 is manufactured, an ink (e.g., predetermined ink) may be jetted onto electrodes in a state in which the light-emitting elements ED are dispersed in the ink (e.g., predetermined ink), such that the light-emitting elements ED may be aligned. Here, a hydrophobic or hydrophilic treatment is performed on a surface of the insulating film EDe, such that the light-emitting elements ED may be maintained in a state in which the light-emitting elements ED are dispersed without being agglomerated with other adjacent light-emitting elements ED in the ink.

Referring to FIG. 9, the light-emitting elements ED may include first to fourth light-emitting elements ED1, ED2, ED3, and ED4. The first semiconductor parts EDa of the first to third light-emitting elements ED1, ED2, and ED3 may be electrically connected to the first electrode AE, and the second semiconductor parts EDb of the first to third light-emitting elements ED1, ED2, and ED3 may be electrically connected to the second electrode CE. The first to third light-emitting elements ED1, ED2, and ED3 may be normally aligned between the first and second electrodes AE and CE, and a current may flow to the first to third light-emitting elements ED1, ED2, and ED3 according to a potential difference between the second and third nodes N2 and N3.

A plurality of fourth light-emitting elements ED4 fails to be aligned, such that a current may not flow to the plurality of fourth light-emitting elements ED4. In FIG. 9, the first semiconductor parts EDa of the fourth light-emitting elements ED4 are electrically connected to the second electrode CE, and the second semiconductor parts EDb of the fourth light-emitting elements ED4 are electrically connected to the first electrode AE, such that the fourth light-emitting elements ED4 may fail to be correctly aligned, but the present disclosure is not limited thereto. As another example, the first semiconductor parts EDa of the fourth light-emitting elements ED4 are electrically insulated from the first electrode AE or the second semiconductor parts EDb of the fourth light-emitting elements ED4 are electrically insulated from the second electrode CE, such that the fourth light-emitting elements ED4 may fail to be aligned.

The driving current Itot may be divided, and may flow to the first to third light-emitting elements ED1, ED2, and ED3. The driving current Itot may be divided into first to third currents I1, I2, and I3. The first current I1 may flow to the first light-emitting element ED1, the second current I2 may flow to the second light-emitting element ED2, and the third current I3 may flow to the third light-emitting element ED3. A magnitude of each of the first to third currents I1, I2, and I3 may be different depending on current-voltage characteristics of each of the first to third light-emitting elements ED1, ED2, and ED3. The first to third currents I1, I2, and I3 may flow to the first to third light-emitting elements ED1, ED2, and ED3, respectively, and a first driving voltage Vf1 may be applied between the second and third nodes N2 and N3. As the number of light-emitting elements ED, to which a current may flow among the plurality of light-emitting elements ED, increases, a magnitude of a current flowing to one light-emitting element ED may decrease.

Figure 11:
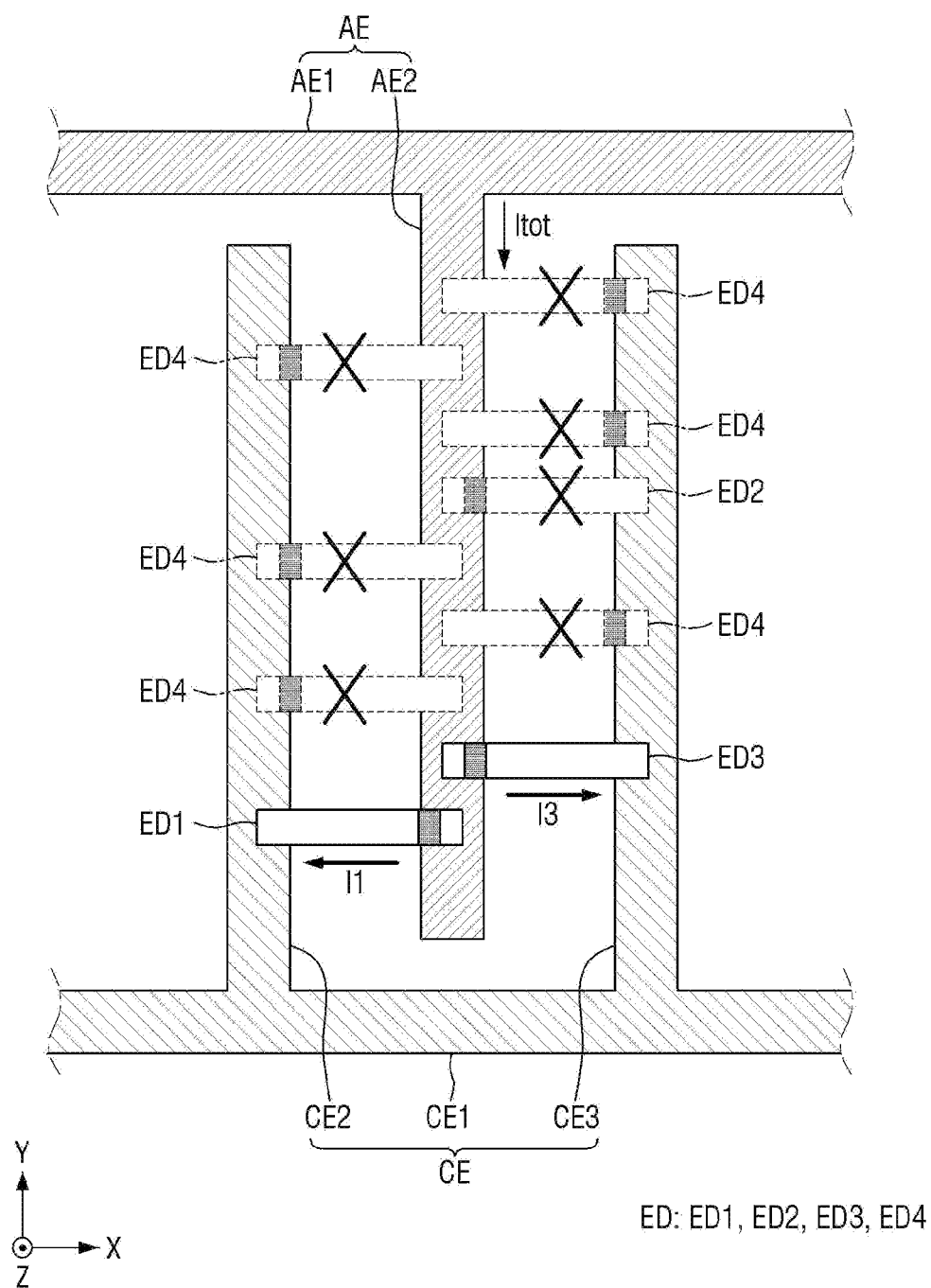
FIG. 11 is a plan view illustrating another example of a current flowing to a plurality of light-emitting elements in the display device according to one or more embodiments.
Figure 12:
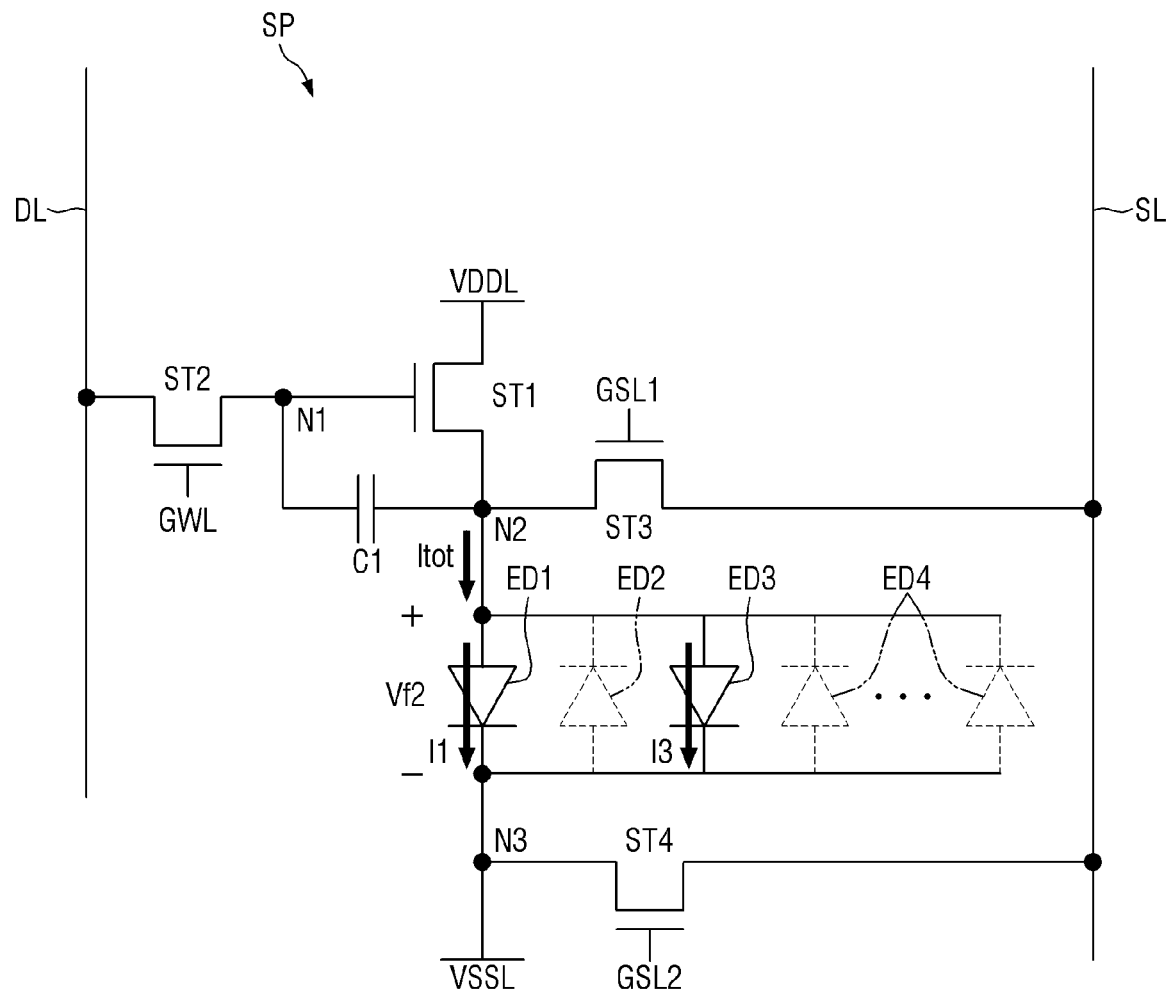
FIG. 12 is a circuit diagram illustrating the display device of FIG. 11.

FIG. 11 is a plan view illustrating another example of a current flowing to a plurality of light-emitting elements in the display device according to one or more embodiments, and FIG. 12 is a circuit diagram illustrating the display device of FIG. 11. The display device of FIGS. 11 and 12 refers to a case where a current does not flow to the second light-emitting element ED2 in the display device of FIGS. 9 and 10 for a reason corresponding to usage over time.

Referring to FIGS. 11 and 12, the light-emitting elements ED may include first to fourth light-emitting elements ED1, ED2, ED3, and ED4. A current may flow to the first and third light-emitting elements ED1 and ED3 according to a potential difference between the second and third nodes N2 and N3. A current may not flow to the second light-emitting element ED2 for reasons, such as deterioration or exhaustion of lifespan of the second light-emitting element ED2. A plurality of fourth light-emitting elements ED4 fails to be correctly aligned, such that a current may not flow to the plurality of fourth light-emitting elements ED4.

The driving current Itot may be divided, and may flow to the first and third light-emitting elements ED1 and ED3. The driving current Itot may be divided into first and third currents I1 and I3. The first current I1 may flow to the first light-emitting element ED1, and the third current I3 may flow to the third light-emitting element ED3. A magnitude of each of the first and third currents I1 and I3 may be different depending on current-voltage characteristics of each of the first and third light-emitting elements ED1 and ED3. As the number of light-emitting elements ED to which a current may flow among the plurality of light-emitting elements ED decreases, a magnitude of a current flowing to one light-emitting element ED may increase. The first and third currents I1 and I3 may flow to the first and third light-emitting elements ED1 and ED3, respectively, and a second driving voltage Vf2 may be applied between the second and third nodes N2 and N3.

A magnitude of the driving current Itot of FIGS. 9 and 10 may be the same as a magnitude of the driving current Itot of FIGS. 11 and 12. In FIGS. 9 and 10, the driving current Itot has been divided into the first to third currents I1, I2, and I3, but in FIGS. 11 and 12, the driving current Itot is divided into the first and third currents I1 and I3, such that a magnitude of each of the first and third currents I1 and I3 may increase. Accordingly, the second driving voltage Vf2 of FIG. 12 may be greater than that of the first driving voltage Vf1 of FIG. 10.

Figure 13:
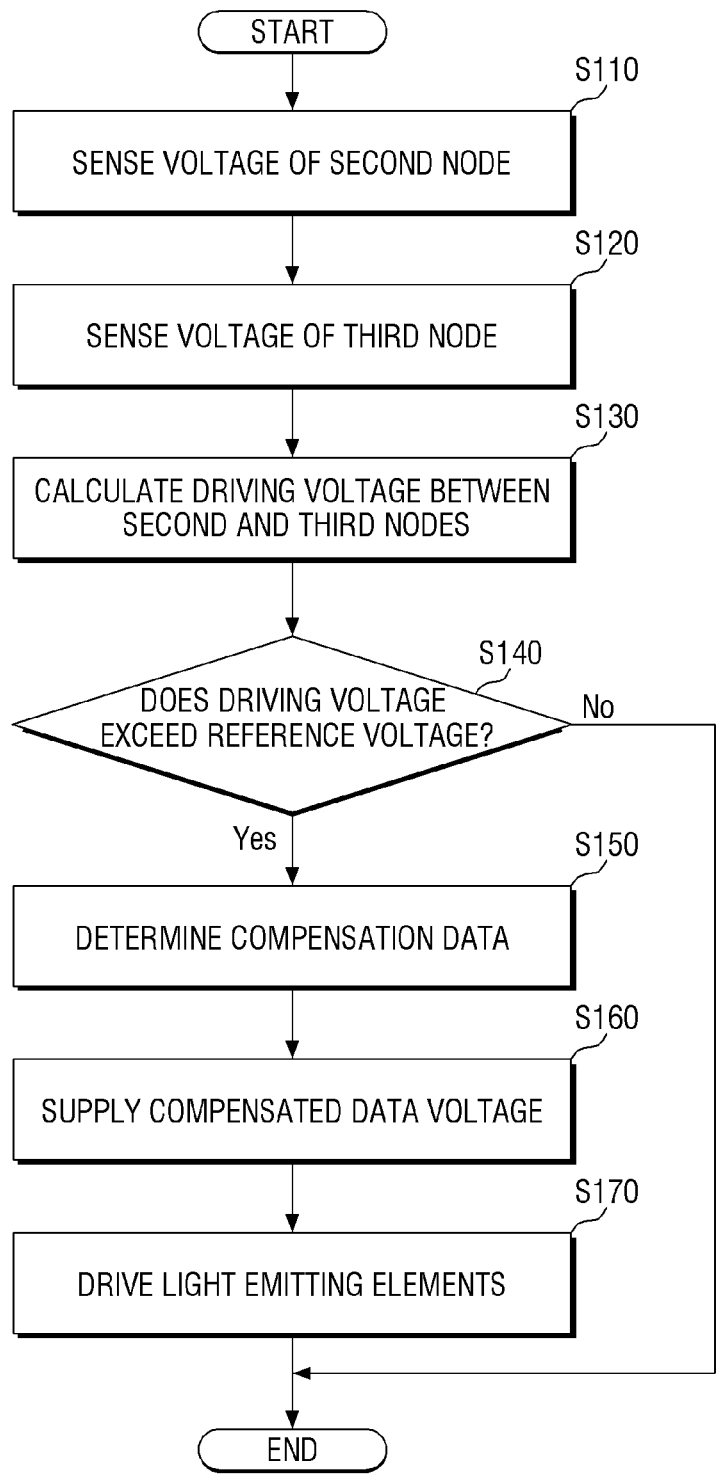
FIG. 13 is a flowchart illustrating a current compensation process of the display device according to one or more embodiments.

FIG. 13 is a flowchart illustrating a current compensation process of the display device according to one or more embodiments.

Referring to FIG. 13, the display driver 310 may sense the pixels SP located in some rows among the plurality of pixels SP during the rest period VBP.

The display driver 310 may sense the voltage of the second node N2 (S110). The third transistor ST3 may be turned on by receiving the first scan sensing signal GS1 of the gate high level. The third transistor ST3 may be turned on to supply the voltage of the second node N2 to the sensing line SL.

The display driver 310 may sense the voltage of the third node N3 (S120). The fourth transistor ST4 may be turned on by receiving the second scan sensing signal GS2 of the gate high level. The fourth transistor ST4 may be turned on to supply the voltage of the third node N3 to the sensing line SL.

The display driver 310 may calculate the driving voltage by calculating the potential difference between the second and third nodes N2 and N3 (S130).

In FIGS. 9 and 10, the display driver 310 may determine whether the first driving voltage Vf1 exceeds a reference voltage (S140). When the first driving voltage Vf1 is the reference voltage or less, the current compensation process may end, and the display driver 310 may drive the light-emitting elements ED in the same manner as before.

In FIGS. 11 and 12, the display driver 310 may determine whether the second driving voltage Vf2 exceeds a reference voltage (S140). Here, that the second driving voltage Vf2 exceeds the reference voltage means that a hot spot may occur or deterioration of the light-emitting element ED may be accelerated.

When the second driving voltage Vf2 exceeds the reference voltage, the display driver 310 may determine compensation data according to a magnitude of the second driving voltage Vf2 (S150). For example, the display driver 310 may determine compensation data based on a preset lookup table, but the present disclosure is not limited thereto.

The display driver 310 may compensate for the data voltage when the second driving voltage Vf2 exceeds the reference voltage. The display driver 310 may generate a compensated data voltage by applying the compensation data to the digital video data received from the graphic system. The display driver 310 may supply the compensated data voltage to the sensed pixel SP (S160).

The display driver 310 may drive the plurality of light-emitting elements ED by supplying the compensated data voltage (S170). The compensated data voltage may be lower than a data voltage before being compensated for, and a magnitude of the driving current Itot may decrease. Accordingly, a magnitude of each of the first and third currents I1 and I3 flowing to the first and third light-emitting elements ED1 and ED3 may decrease, and hot spots or deterioration of the first and third light-emitting elements ED1 and ED3 may be reduced or prevented.

Figure 14:
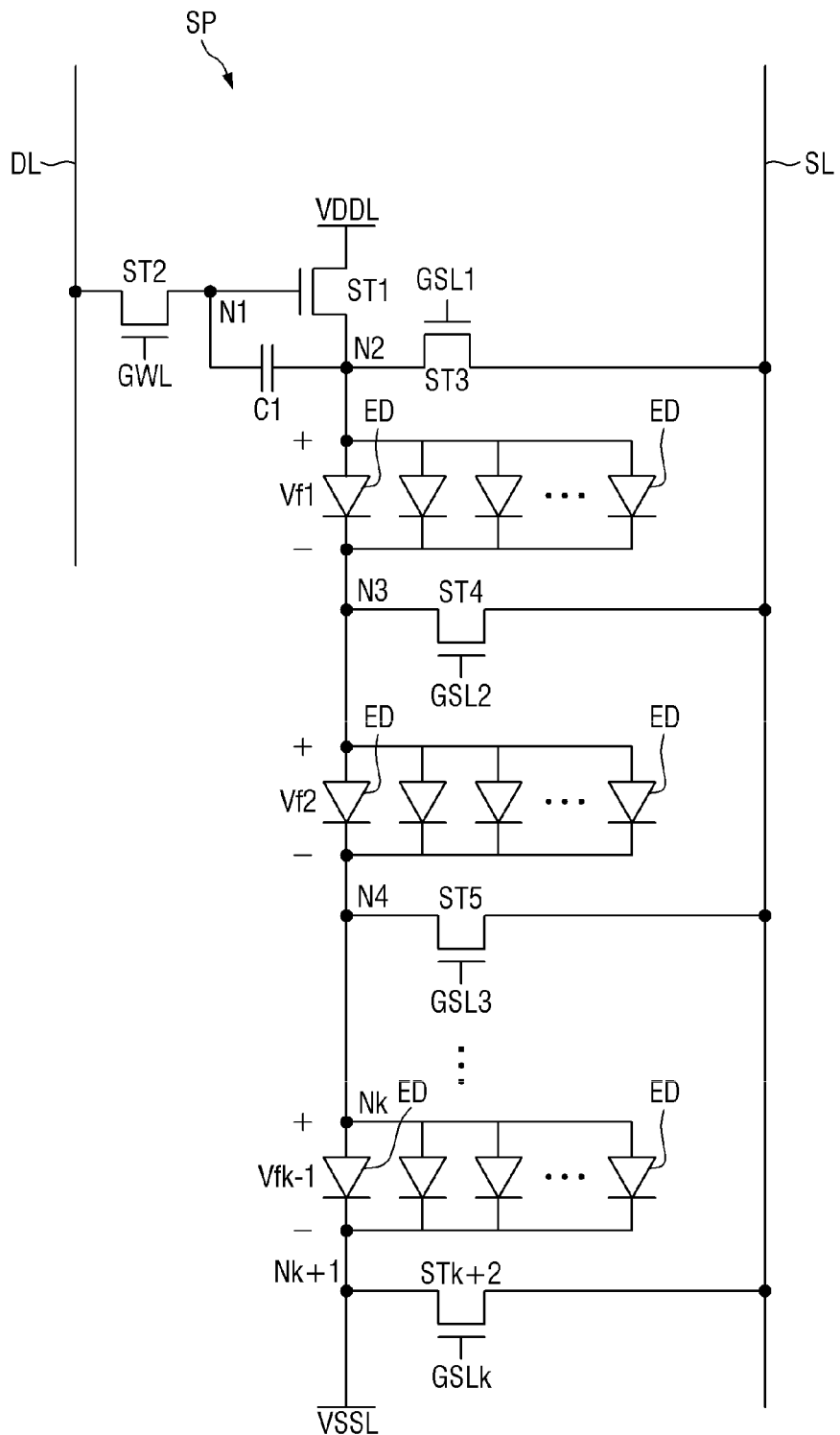
FIG. 14 is a circuit diagram illustrating a pixel of a display device according to one or more other embodiments.
Figure 15:
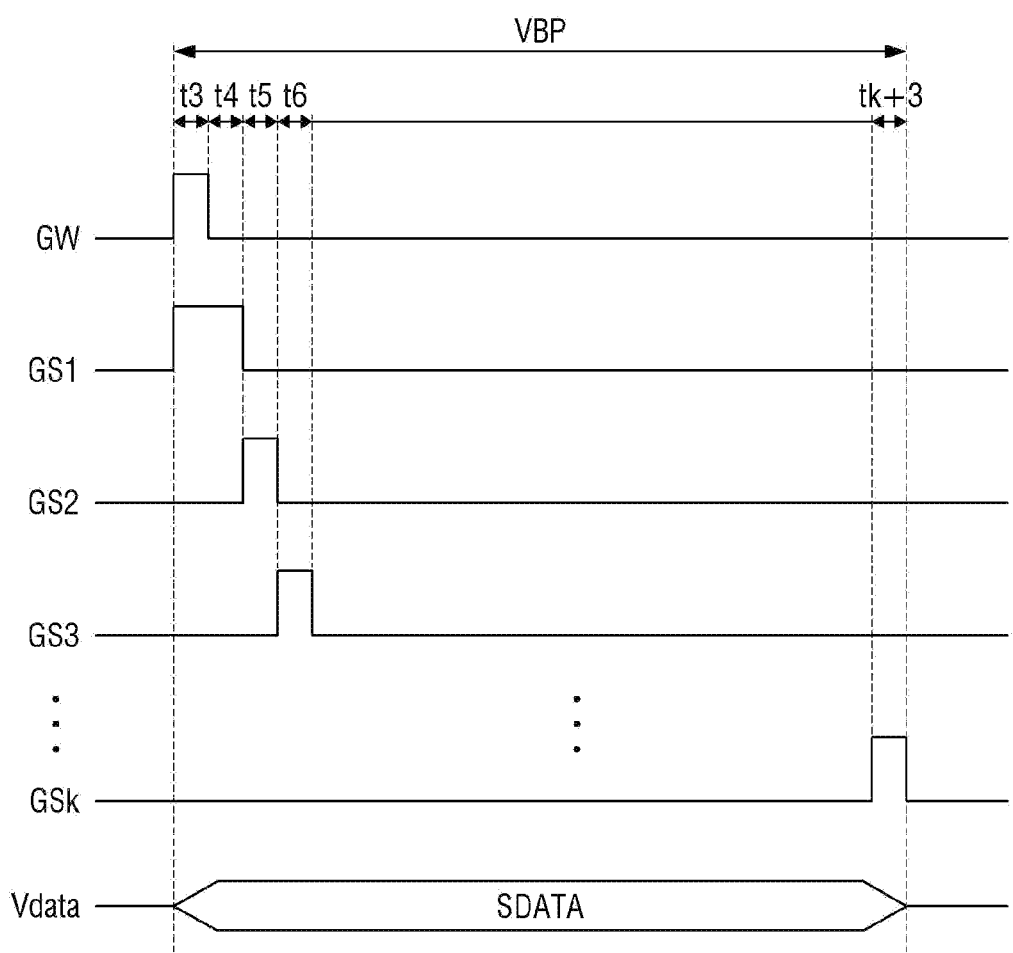
FIG. 15 is a timing diagram illustrating signals and voltages of some pixels during a rest period in the display device according to one or more other embodiments.

FIG. 14 is a circuit diagram illustrating a pixel of a display device according to one or more other embodiments, and FIG. 15 is a timing diagram illustrating signals and voltages of some pixels during a rest period in the display device according to one or more other embodiments.

Referring to FIGS. 14 and 15, the display panel 300 may include a plurality of pixels SP. Each of the plurality of pixels SP may be connected to a scan write line GWL, first to k-th scan sensing lines GSL1, GSL2, GSL3, . . . , GSLk (here, k is an integer of 4 or more), a data line DL, a sensing line SL, a high potential line VDDL, and a low potential line VSSL.

The pixel SP may include first to k+2th transistors ST1, ST2, ST3, ST4, ST5, . . . , STk+2, a first capacitor C1, and a plurality of light-emitting elements ED.

The first transistor ST1 may include a gate electrode, a drain electrode, and a source electrode. The gate electrode of the first transistor ST1 may be connected to a first node N1, the drain electrode of the first transistor ST1 may be connected to the high potential line VDDL, and the source electrode of the first transistor ST1 may be connected to a second node N2. The first transistor ST1 may be a driving transistor for adjusting a current flowing from the high potential line VDDL to the light-emitting element ED according to a voltage difference between the gate electrode and the source electrode. The first transistor ST1 may control a drain-source current (or a driving current) based on a data voltage applied to the gate electrode.

The plurality of light-emitting elements ED may receive the driving current to emit light. Some of the plurality of light-emitting elements ED may be connected to each other in parallel between the second and third nodes N2 and N3. Some others of the plurality of light-emitting elements ED may be connected to each other in parallel between the third and fourth nodes N3 and N4. Some others of the plurality of light-emitting elements ED may be connected to each other in parallel between k-th and k+1-th nodes Nk and Nk+1. A light emission amount or luminance of the light-emitting element ED may be proportional to a magnitude of the driving current.

The second transistor ST2 may receive a scan write signal GW of a gate high level during a third period t3 of a rest period VBP. The second transistor ST2 may be turned on during the third period t3 to electrically connect the data line DL and the first node N1, which is the gate electrode of the first transistor ST1, to each other. The second transistor ST2 may supply a data voltage Vdata corresponding to sensing data SDATA to the first node N1 during the third period t3. A gate electrode of the second transistor ST2 may be connected to the scan write line GWL, a drain electrode of the second transistor ST2 may be connected to the data line DL, and a source electrode of the second transistor ST2 may be connected to the first node N1.

The third transistor ST3 may receive a first scan sensing signal GS1 of a gate high level during third and fourth periods t3 and t4 of the rest period VBP. The third transistor ST3 may electrically connect the second node N2, which is the source electrode of the first transistor ST1, and the sensing line SL to each other during the third and fourth periods t3 and t4. The third transistor ST3 may supply an initialization voltage to the second node N2 during the third period t3. The third transistor ST3 may supply a voltage of the second node N2 to the sensing line SL during the fourth period t4. A gate electrode of the third transistor ST3 may be connected to the first scan sensing line GSL1, the drain electrode of the third transistor ST3 may be connected to the second node N2, and a source electrode of the third transistor ST3 may be connected to the sensing line SL.

The fourth transistor ST4 may receive a second scan sensing signal GS2 of a gate high level during a fifth period t5 of the rest period VBP. The fourth transistor ST4 may be turned on during the fifth period t5 to electrically connect the third node N3 and the sensing line SL to each other. The fourth transistor ST4 may supply a voltage of the third node N3 to the sensing line SL during the fifth period t5. A gate electrode of the fourth transistor ST4 may be connected to the second scan sensing line GSL2, a drain electrode of the fourth transistor ST4 may be connected to the third node N3, and a source electrode of the fourth transistor ST4 may be connected to the sensing line SL.

The fifth transistor ST5 may receive a third scan sensing signal GS3 of a gate high level during a sixth period t6 of the rest period VBP. The fifth transistor ST5 may be turned on during the sixth period t6 to electrically connect the fourth node N4 and the sensing line SL to each other. The fifth transistor ST5 may supply a voltage of the fourth node N4 to the sensing line SL during the sixth period t6. A gate electrode of the fifth transistor ST5 may be connected to the third scan sensing line GSL3, a drain electrode of the fifth transistor ST5 may be connected to the fourth node N4, and a source electrode of the fifth transistor ST5 may be connected to the sensing line SL.

The k+2-th transistor STk+2 may receive a k-th scan sensing signal GSk of a gate high level during a k+3-th period tk+3 of the rest period VBP. The k+2-th transistor STk+2 may be turned on during the k+3-th period tk+3 to electrically connect the k+1-th node Nk+1 and the sensing line SL to each other. The k+2-th transistor STk+2 may supply a voltage of the k+1-th node Nk+1 to the sensing line SL during the k+3-th period tk+3. A gate electrode of the k+2-th transistor STk+2 may be connected to the k-th scan sensing line GSLk, a drain electrode of the k+2-th transistor STk+2 may be connected to the k+1-th node Nk+1, and a source electrode of the k+2-th transistor STk+2 may be connected to the sensing line SL. The k+1-th node Nk+1 may be connected to the low potential line VSSL.

Figure 16:
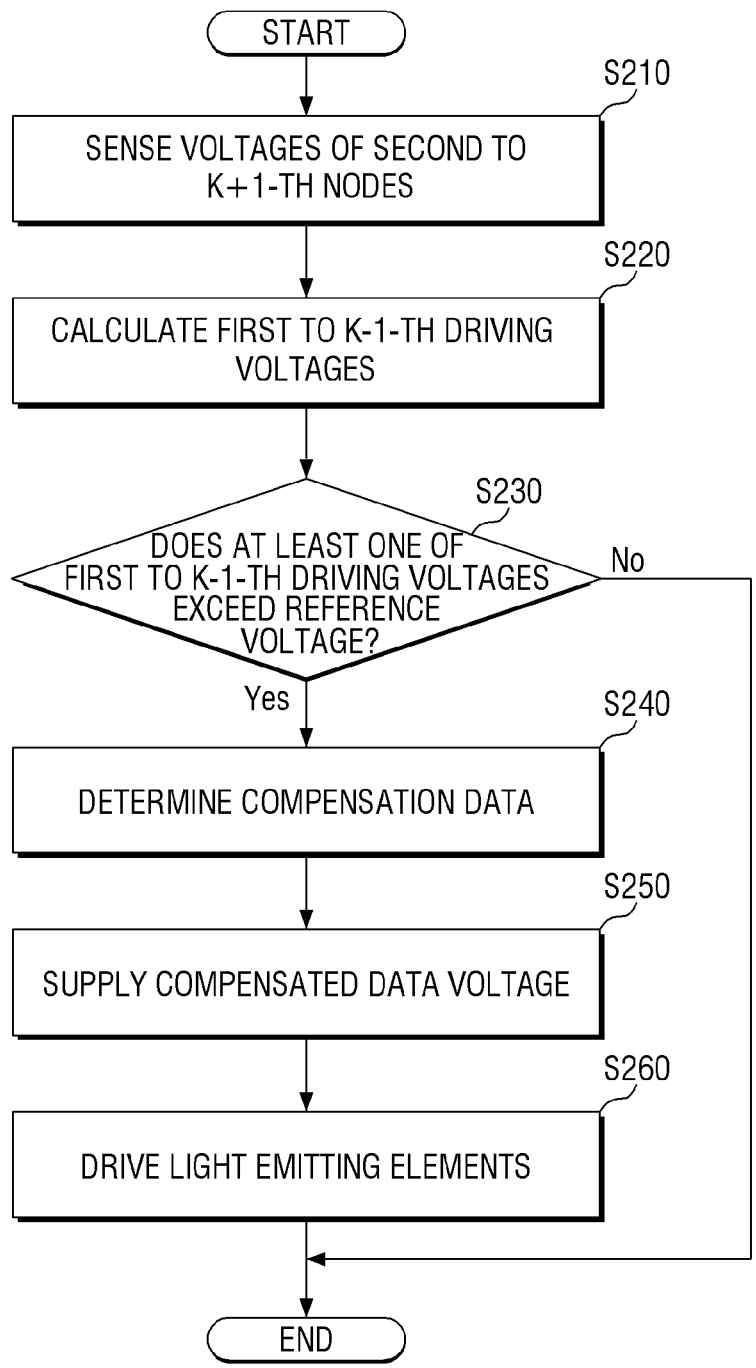
FIG. 16 is a flowchart illustrating a current compensation process of the display device according to one or more other embodiments.

FIG. 16 is a flowchart illustrating a current compensation process of the display device according to one or more other embodiments.

Referring to FIG. 16, the display driver 310 may sense the pixels SP located in some rows among the plurality of pixels SP during the rest period VBP.

The display driver 310 may sense the voltages of the second to k+1-th nodes N2, N3, N4, ..., Nk+1 (S210). The third transistor ST3 may be turned on by receiving the first scan sensing signal SG1 of the gate high level, and may supply the voltage of the second node N2 to the sensing line SL. The fourth transistor ST4 may be turned on by receiving the second scan sensing signal SG2 of the gate high level, and may supply the voltage of the third node N3 to the sensing line SL. The fifth transistor ST5 may be turned on by receiving the third scan sensing signal GS3 of the gate high level, and may supply the voltage of the fourth node N4 to the sensing line SL. The k+2-th transistor STk+2 may be turned on by receiving the k-th scan sensing signal GSk of the gate high level, and may supply the voltage of the k+1-th node Nk+1 to the sensing line SL.

The display driver 310 may calculate first to k−1-th driving voltages Vf1, Vf2, ..., Vfk−1 by calculating potential differences between the second to k+1-th nodes N2, N3, N4, ..., Nk+1 (S220). The display driver 310 may calculate the first driving voltage Vf1 by calculating the potential difference between the second and third nodes N2 and N3. The display driver 310 may calculate the second driving voltage Vf2 by calculating the potential difference between the third and fourth nodes N3 and N4. The display driver 310 may calculate the k−1-th driving voltage Vfk−1 by calculating the potential difference between the k-th and k+1-th nodes Nk and Nk+1.

The display driver 310 may determine whether at least one of the first to k−1-th driving voltages Vf1, Vf2, ..., Vfk−1 exceeds a reference voltage (S230). When at least one driving voltage is the reference voltage or less, the current compensation process may end, and the display driver 310 may drive the light-emitting elements ED in the same manner as before. Here, that the driving voltage exceeds the reference voltage means that a hot spot may occur or deterioration of the light-emitting element ED may be accelerated.

When at least one of the first to k−1-th driving voltages Vf1, Vf2, ..., Vfk−1 exceeds the reference voltage, the display driver 310 may determine compensation data according to a magnitude of at least one driving voltage (S240). For example, the display driver 310 may determine compensation data based on a preset lookup table, but is not limited thereto.

The display driver 310 may compensate for the data voltage when at least one of the first to k−1-th driving voltages Vf1, Vf2, ..., Vfk−1 exceeds the reference voltage. The display driver 310 may generate a compensated data voltage by applying the compensation data to the digital video data received from the graphic system. The display driver 310 may supply the compensated data voltage to the sensed pixel SP (S250).

The display driver 310 may drive the plurality of light-emitting elements ED by supplying the compensated data voltage (S260). The compensated data voltage may be lower than the previous data voltage, and a magnitude of the driving current Itot may decrease. Accordingly, a magnitude of a current flowing to at least one light-emitting element ED may decrease, and a hot spot or deterioration of the light-emitting element ED may be reduced or prevented.

What is claimed is:

1. A display device comprising:
    pixels arranged along rows and columns, and comprising:
        light-emitting elements;
        a first transistor for supplying a driving current to the light-emitting elements;
        a second transistor for supplying a data voltage to a first node at a gate electrode of the first transistor upon receiving a scan write signal of a gate high level during a first period;
        a third transistor for electrically connecting a second node, which is at a first electrode, and a sensing line upon receiving a first scan sensing signal of a gate high level during the first period and during a second period after the first period; and
        a fourth transistor for electrically connecting a third node, which is at a second electrode, and the sensing line upon receiving a second scan sensing signal of a gate high level during a third period; and
    a display driver for driving the pixels, for sensing voltages of the second node and the third node to calculate a driving voltage across the light-emitting elements, and for compensating for the data voltage in case that the driving voltage exceeds a reference voltage,
    wherein the first period, the second period, and the third period are in a same frame.

2. The display device of claim 1, wherein the display driver is configured to determine compensation data based on a preset lookup table when the driving voltage exceeds the reference voltage.

3. The display device of claim 2, wherein the display driver is configured to receive digital video data, is configured to generate the data voltage, and is configured to generate a compensated data voltage by applying the compensation data to the digital video data.

4. The display device of claim 3, wherein the compensated data voltage is lower than the data voltage before being compensated.

5. The display device of claim 1, wherein the light-emitting elements are connected in parallel between the second node and the third node, and
    wherein a magnitude of a current flowing to one of the light-emitting elements increases as a number of light-emitting elements among the light-emitting elements, to which a collective current flows, decreases.

6. The display device of claim 1, wherein the first electrode comprises:

a first portion extending in a first direction; and
a second portion branching from the first portion, and extending in a second direction crossing the first direction, and
wherein the second electrode comprises:
a first portion extending in the first direction;
a second portion branching from one side of the first portion, and extending toward one side of the second portion of the first electrode; and
a third portion branching from another side of the first portion, and extending toward another side of the second portion of the first electrode.

7. The display device of claim 6, wherein the light-emitting elements comprise:
a first semiconductor layer comprising at least one semiconductor material doped with a p-type dopant, and electrically connected to the second portion of the first electrode; and
a second semiconductor layer comprising at least one semiconductor material doped with an n-type dopant, and electrically connected to the second portion and the third portion of the second electrode.

8. The display device of claim 6, wherein the driving current is configured to be supplied to the second portion of the first electrode, to be divided into the light-emitting elements, and to flow to the second portion and the third portion of the second electrode.

9. A display device comprising:
pixels arranged along rows and columns, and comprising:
light-emitting elements;
a first transistor for supplying a driving current to the light-emitting elements;
a second transistor for supplying a data voltage to a first node at a gate electrode of the first transistor upon receiving a scan write signal of a gate high level during a first period;
a third transistor for electrically connecting a second node, which is at a first electrode, and a sensing line upon receiving a first scan sensing signal of a gate high level during the first period and during a second period after the first period; and
a fourth transistor for electrically connecting a third node, which is at a second electrode, and the sensing line upon receiving a second scan sensing signal of a gate high level during a third period after the second period; and
a display driver for driving the pixels, for sensing voltages of the second node and the third node to calculate a driving voltage across the light-emitting elements, and for compensating for the data voltage in case that the driving voltage exceeds a reference voltage,
wherein the display driver is configured to drive the pixels based on a vertical synchronization signal having a low level and a high level during one frame period, and
wherein the display driver is configured to calculate driving voltages of pixels in some rows among the pixels during a rest period in which the vertical synchronization signal has the low level, wherein the rest period comprises the first period, the second period, and the third period.

10. A display device comprising:
pixels arranged along rows and columns, and comprising:
light-emitting elements;
a first transistor for supplying a driving current to the light-emitting elements;
a second transistor for supplying a data voltage to a first node at a gate electrode of the first transistor;
a third transistor for electrically connecting a second node, which is at a source electrode of the first transistor, and a sensing line;
a fourth transistor electrically connecting a third node and the sensing line; and
a fifth transistor electrically connecting a fourth node and the sensing line; and
a display driver for driving the pixels, for sensing voltages of the second to the fourth nodes to calculate a first driving voltage between the second and third nodes, for calculating a second driving voltage between the third and fourth nodes, and for compensating for the data voltage when at least one of the first or second driving voltages exceeds a reference voltage.

11. The display device of claim 10, wherein the display driver is configured to determine compensation data based on a preset lookup table when at least one of the first or second driving voltages exceeds the reference voltage.

12. The display device of claim 11, wherein the display driver is configured to receive digital video data, to generate the data voltage, and to generate a compensated data voltage by applying the compensation data to the digital video data.

13. The display device of claim 12, wherein the compensated data voltage is lower than the data voltage before being compensated.

14. The display device of claim 10, wherein some of the light-emitting elements are connected in parallel between the second and third nodes, and others of the light-emitting elements are connected in parallel between the third and fourth nodes, and
wherein a magnitude of a current flowing to one of the light-emitting elements increases as a number of the light-emitting elements, to which a collective current flows, decreases.

15. The display device of claim 10, wherein the display driver is configured to drive the pixels based on a vertical synchronization signal having a low level and a high level during one frame period, and is configured to calculate first and second driving voltages of pixels in some rows among the pixels during a rest period in which the vertical synchronization signal has the low level.

16. The display device of claim 15, wherein the second transistor is configured to receive a scan write signal of a gate high level during a first period of the rest period,
wherein the third transistor is configured to receive a first scan sensing signal of a gate high level during the first period of the rest period and a second period after the first period,
wherein the fourth transistor is configured to receive a second scan sensing signal of a gate high level during a third period after the second period of the rest period, and
wherein the fifth transistor is configured to receive a third scan sensing signal of a gate high level during a fourth period after the third period of the rest period.

17. The display device of claim 10, further comprising a first electrode at the second node, and a second electrode at the third node, wherein the first electrode comprises:
a first portion extending in a first direction; and
a second portion branching from the first portion, and extending in a second direction crossing the first direction, and
wherein the second electrode comprises:
a first portion extending in the first direction;
a second portion branching from one side of the first portion, and extending toward one side of the second portion of the first electrode; and a third portion branching from another side of the first portion, and extending toward another side of the second portion of the first electrode.

18. The display device of claim 17, wherein the light-emitting elements comprise:
   a first semiconductor layer comprising at least one semiconductor material doped with a p-type dopant, and electrically connected to the second portion of the first electrode; and
   a second semiconductor layer comprising at least one semiconductor material doped with an n-type dopant, and electrically connected to the second portion and the third portion of the second electrode.

19. The display device of claim 17, wherein the driving current is configured to be supplied to the second portion of the first electrode, to be divided into the light-emitting elements, and to flow to the second portion and the third portion of the second electrode.

\* \* \* \* \*